US012616011B2

(12) United States Patent
Chang et al.

(10) Patent No.: US 12,616,011 B2
(45) Date of Patent: Apr. 28, 2026

(54) SEMICONDUCTOR DEVICE INCLUDING A SELF-ALIGNED CONTACT LAYER WITH ENHANCED ETCH RESISTANCE

(71) Applicant: TAIWAN SEMICONDUCTOR MANUFACTURING COMPANY, LTD., Hsinchu (TW)

(72) Inventors: I-Ming Chang, Hsinchu (TW);
Yao-Sheng Huang, Hsinchu (TW);
Hsiang-Pi Chang, Hsinchu (TW);
Lo-Heng Chang, Hsinchu (TW);
Yun-Ju Fan, Hsinchu (TW);
Huang-Lin Chao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 860 days.

(21) Appl. No.: 17/870,367

(22) Filed: Jul. 21, 2022

(65) Prior Publication Data

US 2024/0030311 A1    Jan. 25, 2024

(51) Int. Cl.
| | |
|---|---|
| *H01L 29/66* | (2006.01) |
| *H01L 21/285* | (2006.01) |
| *H01L 21/768* | (2006.01) |
| *H01L 21/8234* | (2006.01) |
| *H10D 30/01* | (2025.01) |
| *H10D 30/62* | (2025.01) |
| *H10D 84/01* | (2025.01) |
| *H10D 84/03* | (2025.01) |
| *H10D 64/01* | (2025.01) |
| *H10D 84/83* | (2025.01) |

(52) U.S. Cl.
CPC .. *H01L 21/76825* (2013.01); *H01L 21/28518* (2013.01); *H01L 21/76897* (2013.01); *H10D 30/024* (2025.01); *H10D 30/62* (2025.01); *H10D 30/6219* (2025.01); *H10D 84/0147* (2025.01); *H10D 84/0149* (2025.01); *H10D 84/0151* (2025.01); *H10D 84/038* (2025.01); *H01L 21/76831* (2013.01); *H10D 64/017* (2025.01); *H10D 84/0158* (2025.01); *H10D 84/834* (2025.01)

(58) Field of Classification Search
CPC ..................... H01L 21/76825; H01L 21/76897
See application file for complete search history.

(56) References Cited

U.S. PATENT DOCUMENTS

| | | | | | |
|---|---|---|---|---|---|
| 4,997,790 | A | * | 3/1991 | Woo | H01L 24/11 257/E21.507 |
| 6,306,759 | B1 | * | 10/2001 | Yen | H01L 21/76831 257/E21.507 |
| 6,803,318 | B1 | * | 10/2004 | Qiao | H01L 21/31116 257/E21.507 |

(Continued)

*Primary Examiner* — Victoria K. Hall
(74) *Attorney, Agent, or Firm* — Birch, Stewart, Kolasch & Birch, LLP

(57) ABSTRACT

A semiconductor device includes a semiconductor fin, an epitaxial region located on a side of the semiconductor fin, a silicide layer disposed on the epitaxial region, a contact plug disposed on the silicide layer and over the epitaxial region, and a self-aligned contact (SAC) layer disposed on the semiconductor fin. At least a part of the SAC layer is implanted with at least one implantation element. The semiconductor fin is spaced apart from the contact plug by the SAC layer.

20 Claims, 77 Drawing Sheets

(56) References Cited

U.S. PATENT DOCUMENTS

| | | | | |
|---|---|---|---|---|
| 9,653,581 | B2* | 5/2017 | Lu | H10D 64/017 |
| 9,852,947 | B1* | 12/2017 | Ko | H01L 21/76897 |
| 11,532,714 | B2* | 12/2022 | Yu | H10D 30/6219 |
| 11,710,664 | B2* | 7/2023 | Yu | H10D 30/43 |
| | | | | 257/365 |
| 2013/0078376 | A1* | 3/2013 | Higashino | C23C 16/45553 |
| | | | | 427/255.39 |
| 2016/0141394 | A1* | 5/2016 | Lu | H10D 30/62 |
| | | | | 438/283 |
| 2016/0268203 | A1* | 9/2016 | Lu | H10D 30/6219 |
| 2016/0276465 | A1* | 9/2016 | Hung | H10D 30/6219 |
| 2017/0263744 | A1* | 9/2017 | Lu | H01L 21/31144 |
| 2018/0083002 | A1* | 3/2018 | Kim | H01L 21/76801 |
| 2018/0166329 | A1* | 6/2018 | Huang | H10D 30/0212 |
| 2018/0219010 | A1* | 8/2018 | Kim | H01L 21/02362 |
| 2019/0157148 | A1* | 5/2019 | Hsieh | H01L 23/5226 |
| 2020/0006127 | A1* | 1/2020 | Khaderbad | H01L 21/76895 |
| 2020/0098591 | A1* | 3/2020 | Lin | H01L 21/76829 |
| 2020/0243385 | A1* | 7/2020 | Huang | H01L 21/0217 |
| 2021/0066500 | A1* | 3/2021 | Liu | H01L 21/7682 |
| 2021/0351039 | A1* | 11/2021 | Huang | H01L 23/485 |
| 2021/0366907 | A1* | 11/2021 | Liao | H10D 84/8311 |
| 2021/0399099 | A1* | 12/2021 | Chu | H01L 21/28525 |
| 2021/0408249 | A1* | 12/2021 | Yu | H01L 23/5283 |
| 2022/0028786 | A1* | 1/2022 | Huang | H10D 30/024 |
| 2022/0037510 | A1* | 2/2022 | Cheng | H10D 84/038 |
| 2022/0102199 | A1* | 3/2022 | Hsiung | H01L 21/76897 |
| 2022/0102204 | A1* | 3/2022 | Hsiung | H10D 30/6219 |
| 2022/0230911 | A1* | 7/2022 | Chen | H01L 21/76877 |
| 2022/0238660 | A1* | 7/2022 | Huang | H10D 62/121 |
| 2022/0310804 | A1* | 9/2022 | Su | H01L 21/76897 |
| 2022/0328631 | A1* | 10/2022 | Chien | H10D 62/151 |
| 2022/0336287 | A1* | 10/2022 | Yu | H10D 30/43 |
| 2022/0359676 | A1* | 11/2022 | Chu | H10D 30/6757 |
| 2022/0375860 | A1* | 11/2022 | Huang | H01L 21/743 |
| 2023/0253313 | A1* | 8/2023 | Wang | H10D 64/017 |
| | | | | 257/368 |
| 2023/0268344 | A1* | 8/2023 | Huang | H10D 30/43 |
| | | | | 257/288 |
| 2023/0402514 | A1* | 12/2023 | Cheng | H10D 30/6729 |
| 2023/0420297 | A1* | 12/2023 | Cheng | H01L 21/76825 |

* cited by examiner

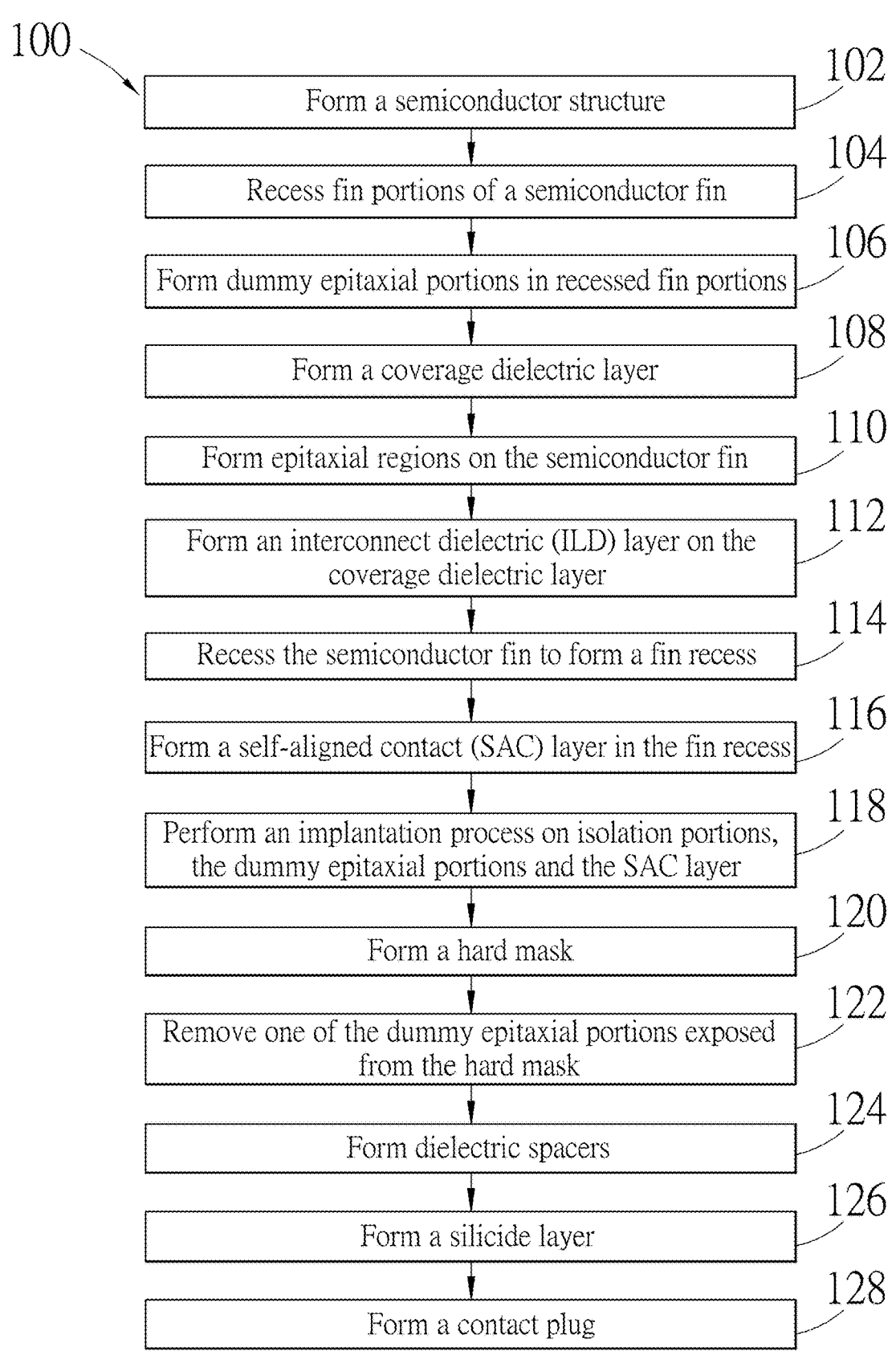

100

| 102 | Form a semiconductor structure |
| 104 | Recess fin portions of a semiconductor fin |
| 106 | Form dummy epitaxial portions in recessed fin portions |
| 108 | Form a coverage dielectric layer |
| 110 | Form epitaxial regions on the semiconductor fin |
| 112 | Form an interconnect dielectric (ILD) layer on the coverage dielectric layer |
| 114 | Recess the semiconductor fin to form a fin recess |
| 116 | Form a self-aligned contact (SAC) layer in the fin recess |
| 118 | Perform an implantation process on isolation portions, the dummy epitaxial portions and the SAC layer |
| 120 | Form a hard mask |
| 122 | Remove one of the dummy epitaxial portions exposed from the hard mask |
| 124 | Form dielectric spacers |
| 126 | Form a silicide layer |
| 128 | Form a contact plug |

Figures 10D, 10E:
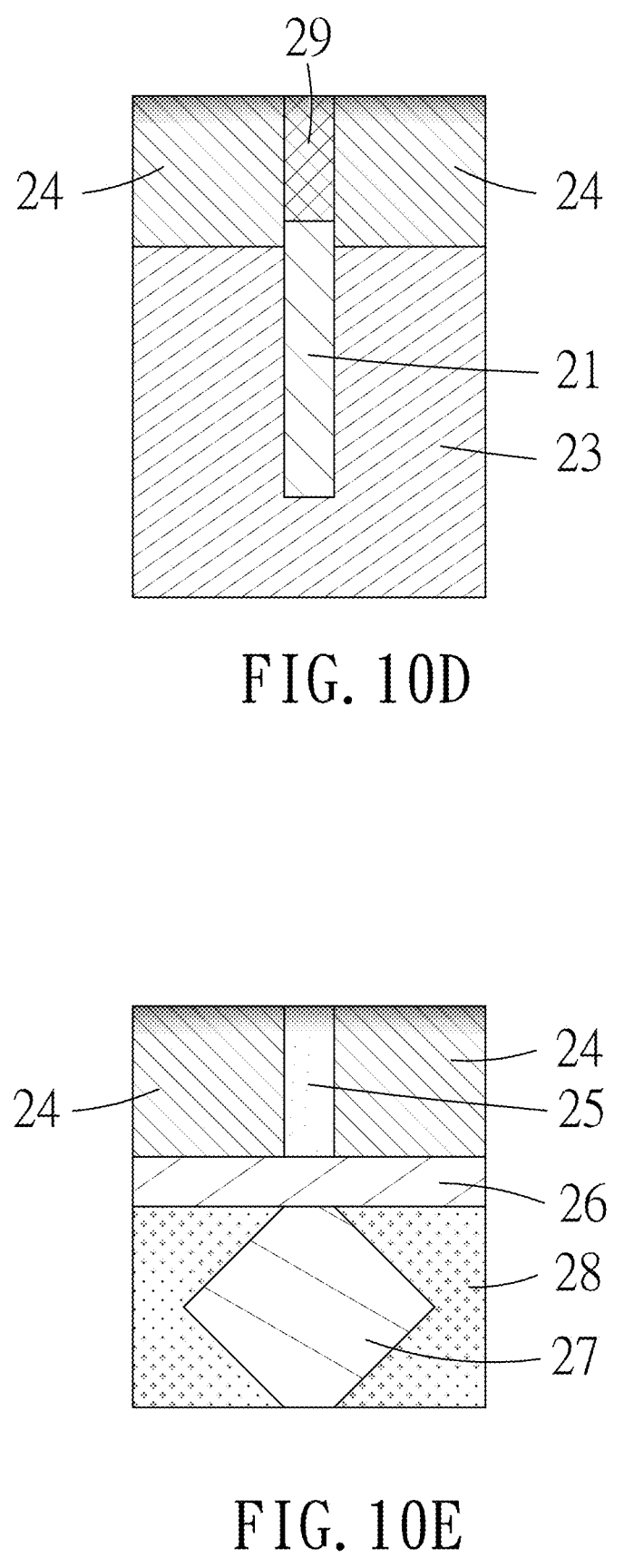

SEMICONDUCTOR DEVICE INCLUDING A SELF-ALIGNED CONTACT LAYER WITH ENHANCED ETCH RESISTANCE

BACKGROUND

Integrated circuits are built in a stacking manner with transistors being formed at a lower level of the integrated circuits and with interconnects, which include wires and vias, being formed on top of the transistors to provide connectivity to the transistors. As the integrated circuits continue to scale down, some proposed to form interconnects including backside via contacts on back sides of the transistors to help space saving and device scaling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow diagram illustrating a method for manufacturing a semiconductor device in accordance with some embodiments.

DETAILED DESCRIPTION

Figure 2A:
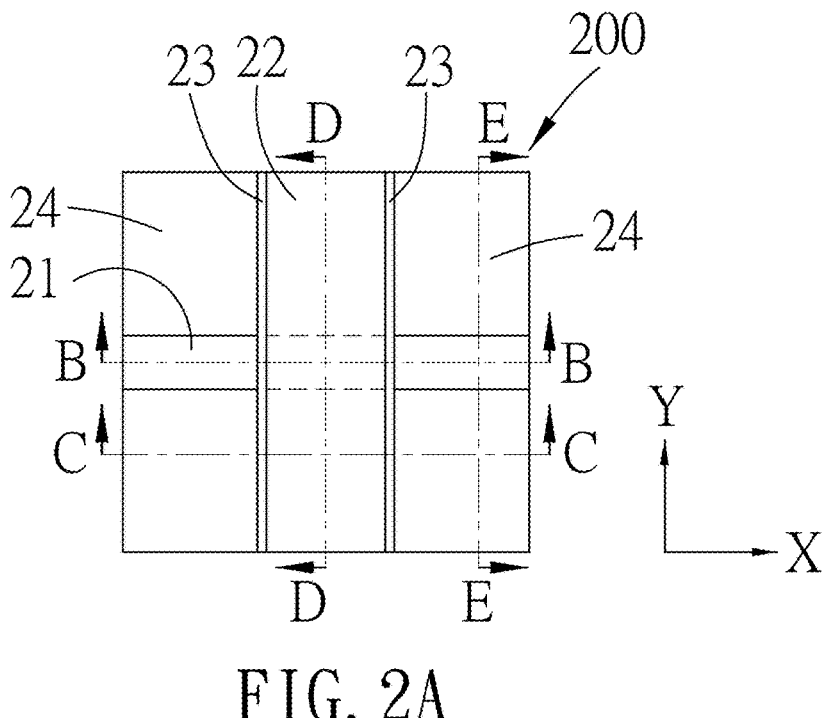
FIGS. 2A-2E to 16A-16E are schematic views illustrating intermediate stages of the method depicted in FIG. 1 in accordance with some embodiments.
Figure 2B:
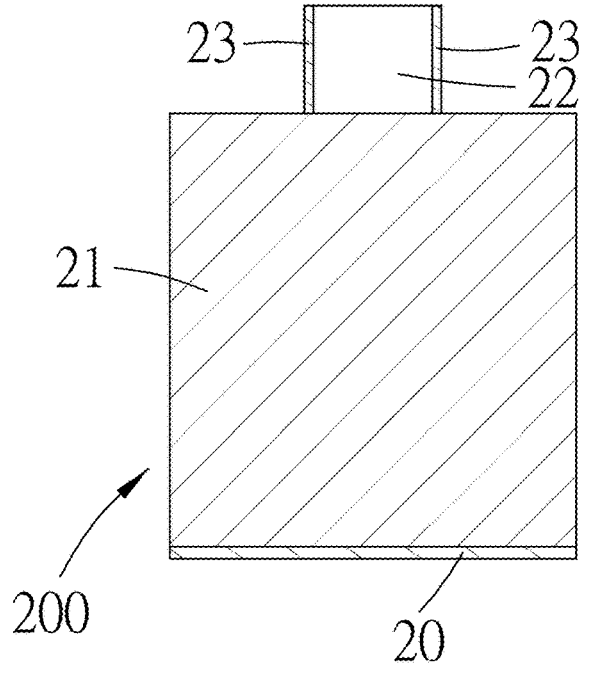
Figure 2C:
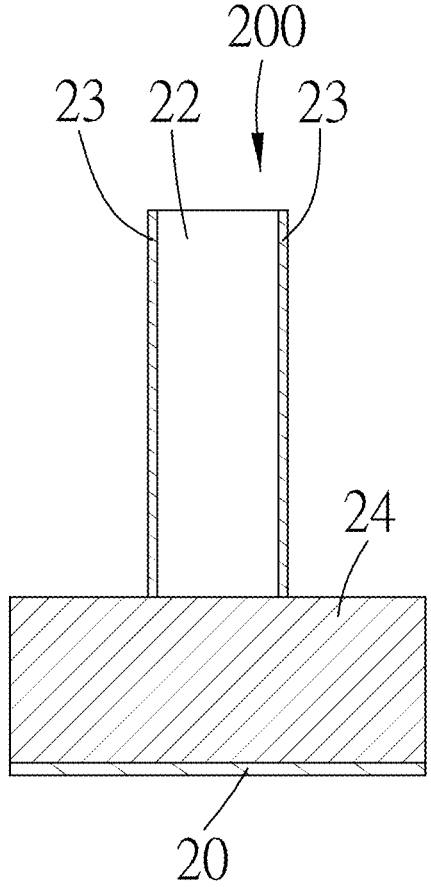
Figure 2D:
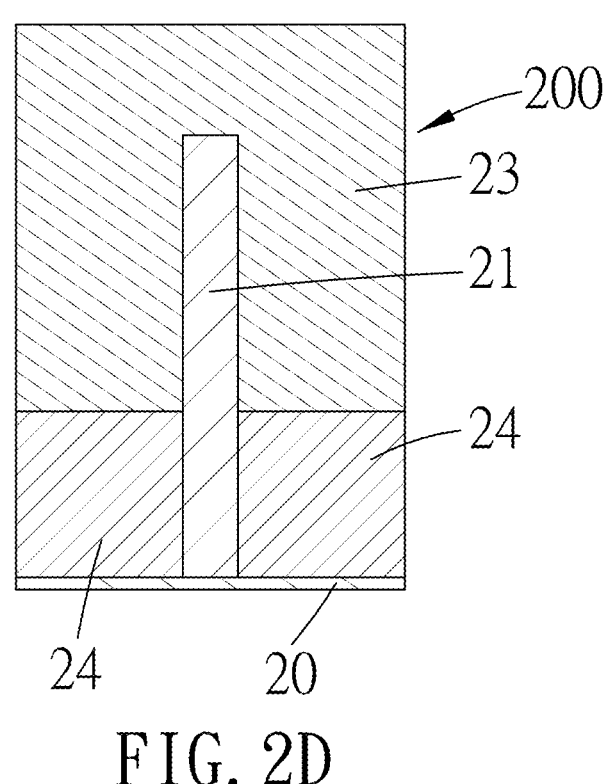
Figure 2E:
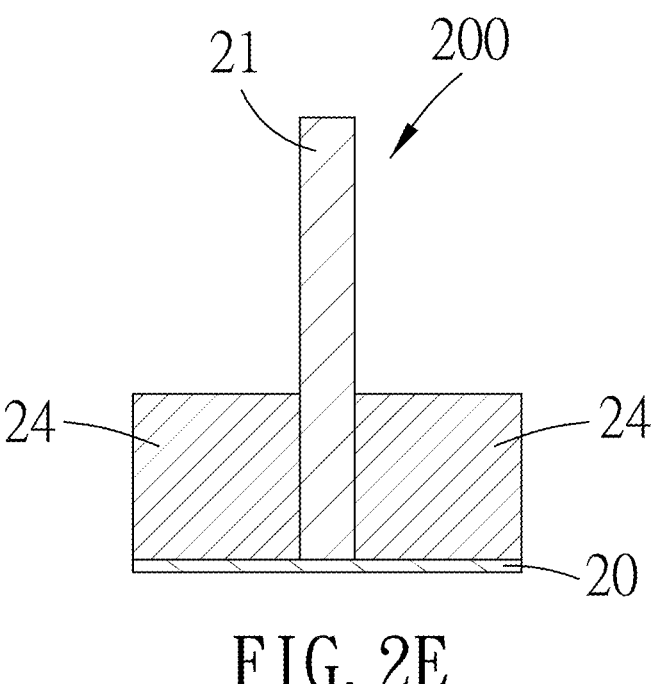
Figure 3A:
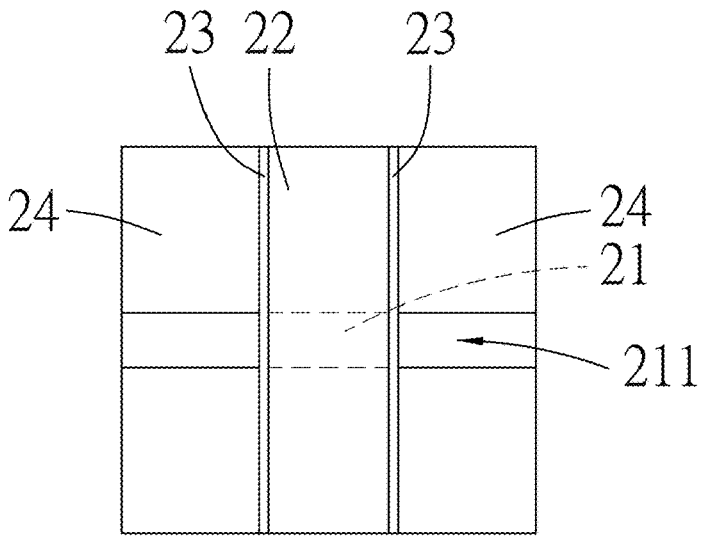
Figure 3B:
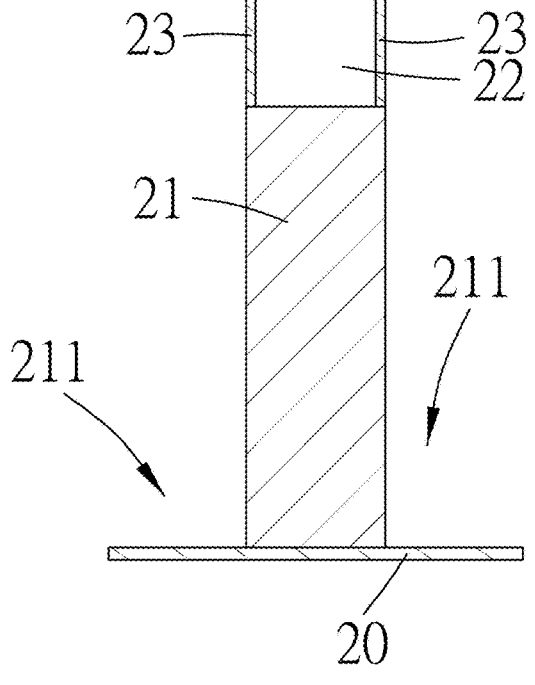
Figure 3C:
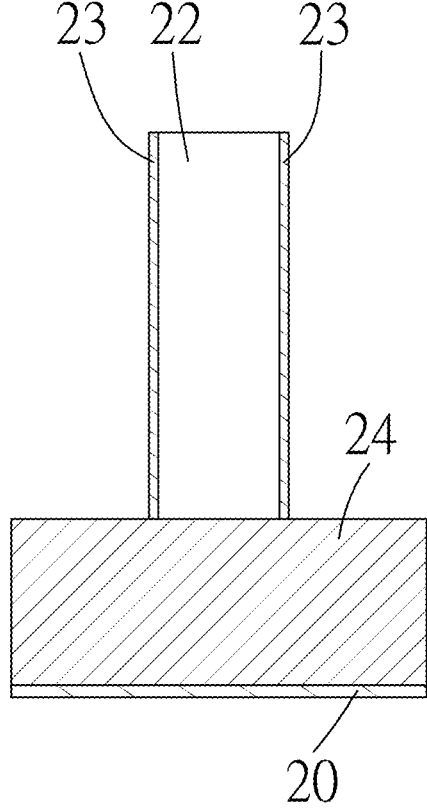
Figure 3D:
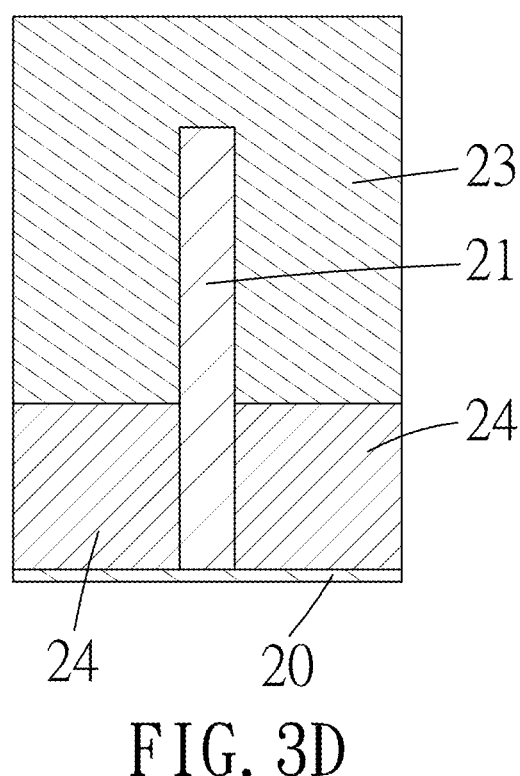
Figure 3E:
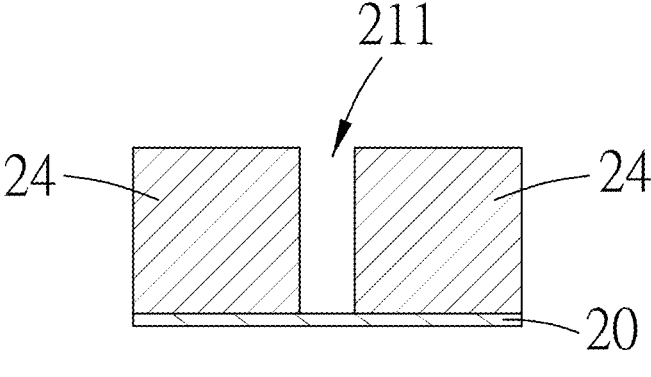
Figure 4A:
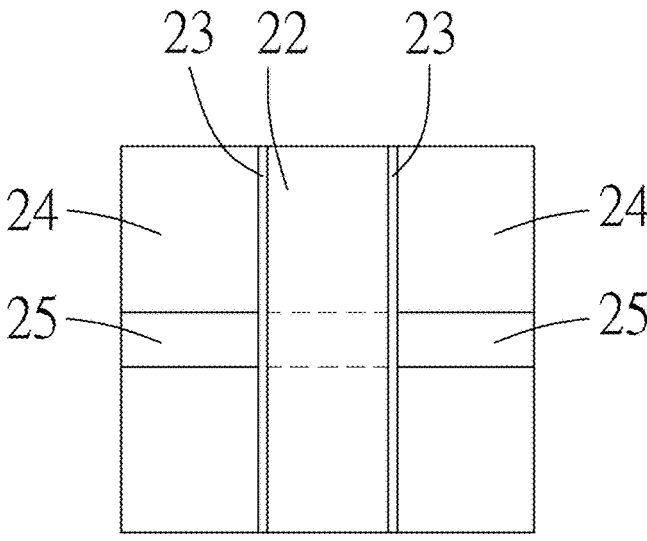
Figure 4B:
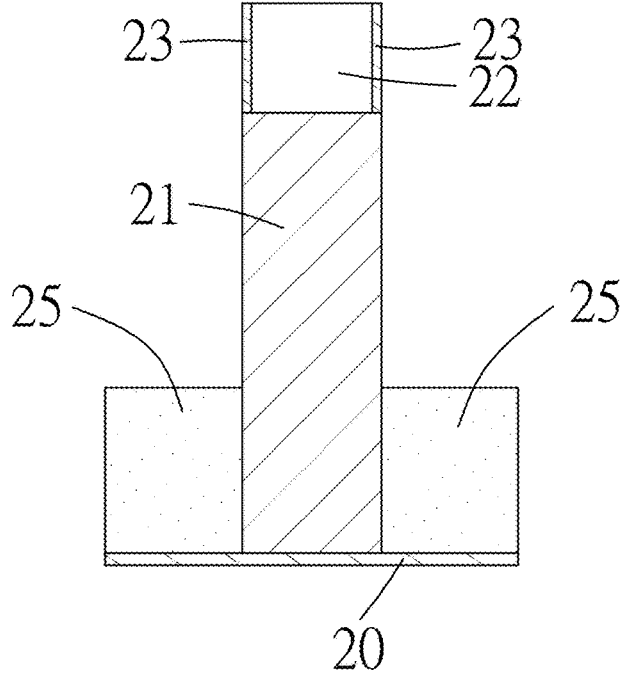
Figure 4C:
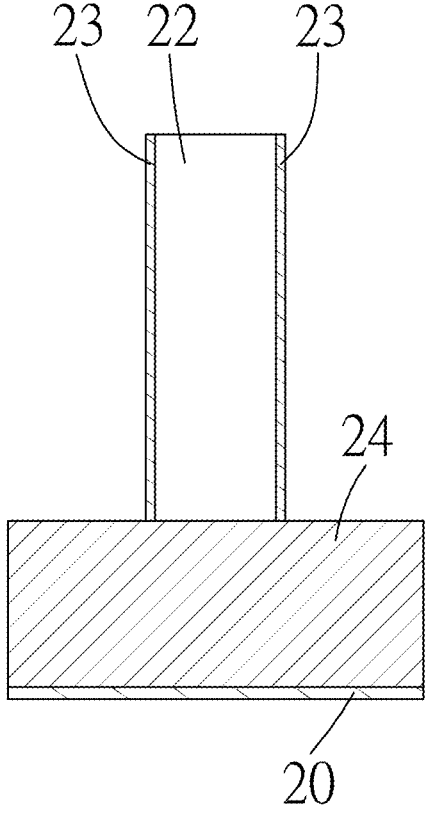
Figures 4D, 4E:
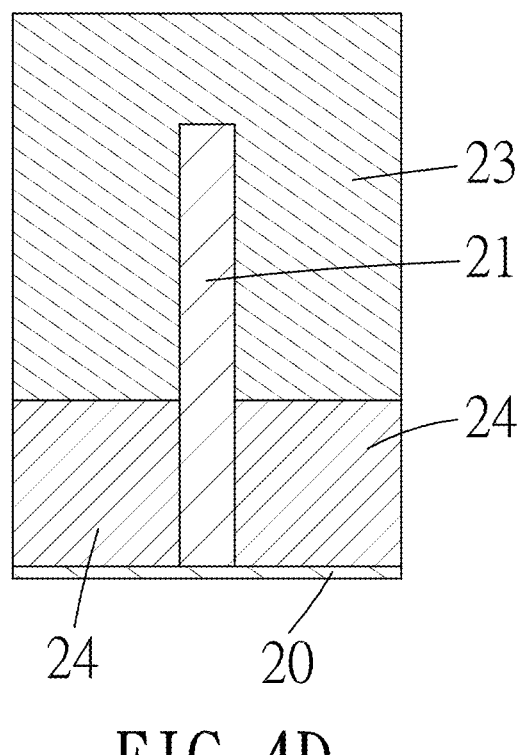
Figure 5A:
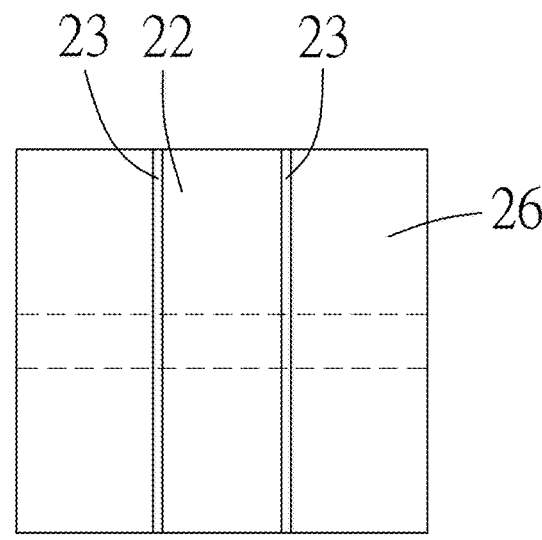
Figure 5B:
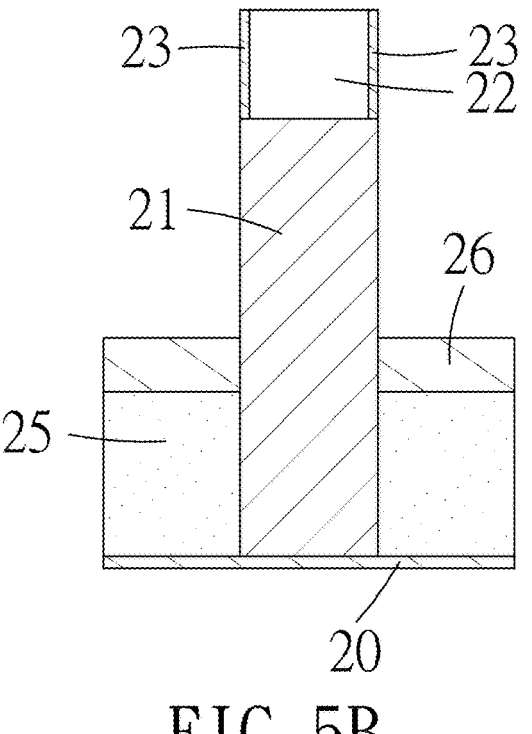
Figure 5C:
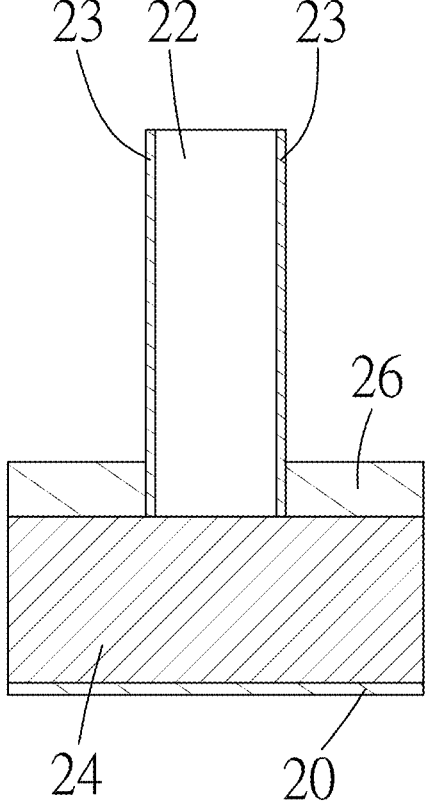
Figure 5D:
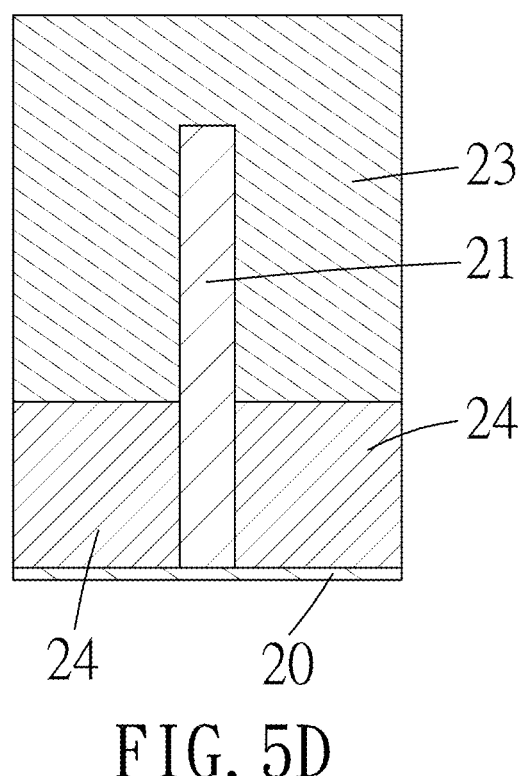
Figure 5E:
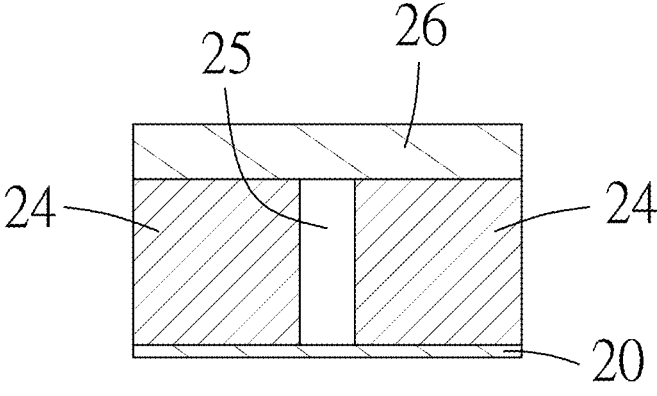
Figure 6A:
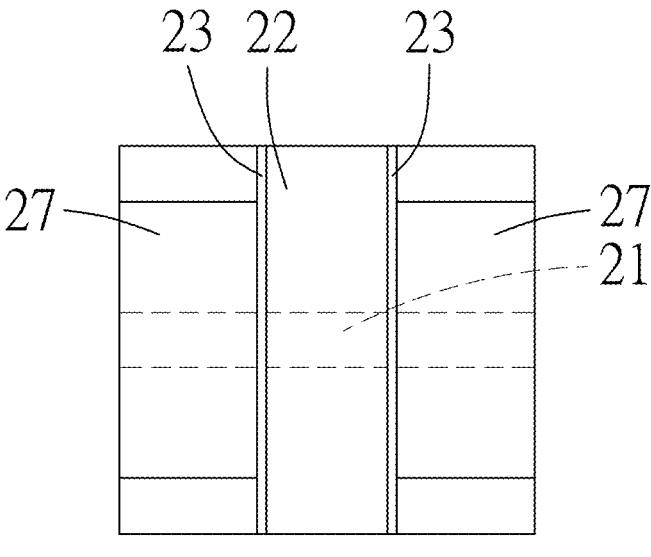
Figure 6B:
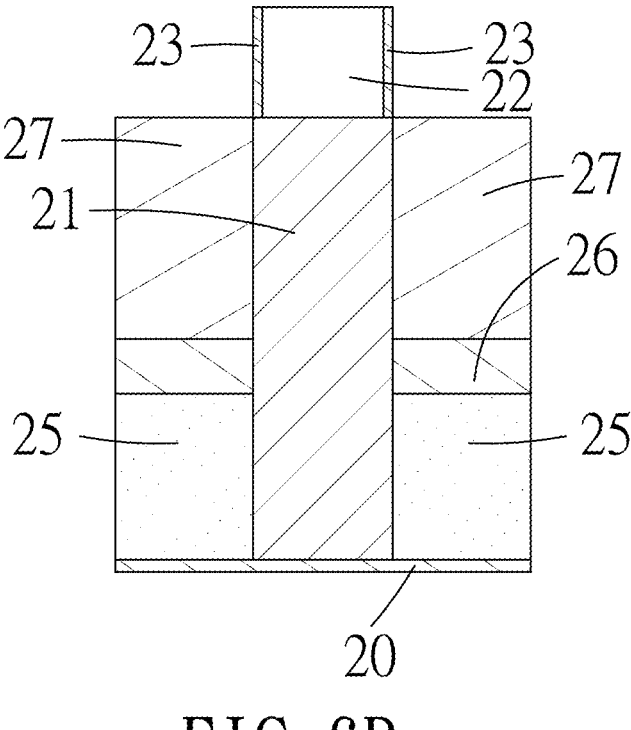
Figure 6C:
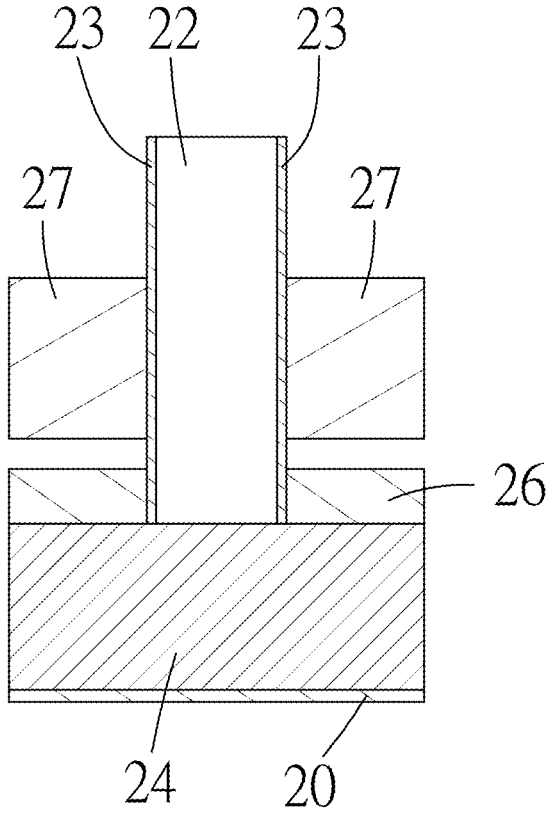
Figure 6D:
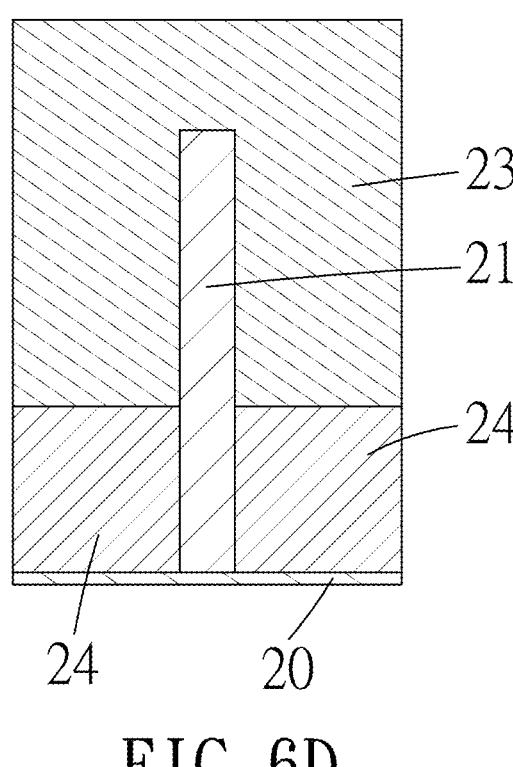
Figure 6E:
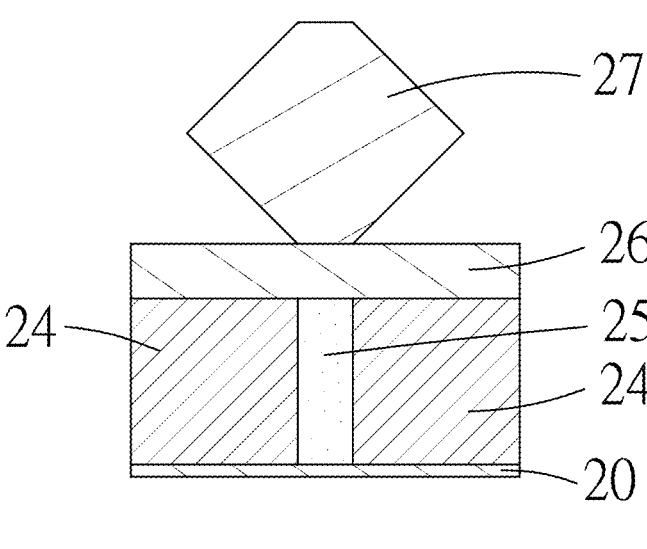
Figure 7A:
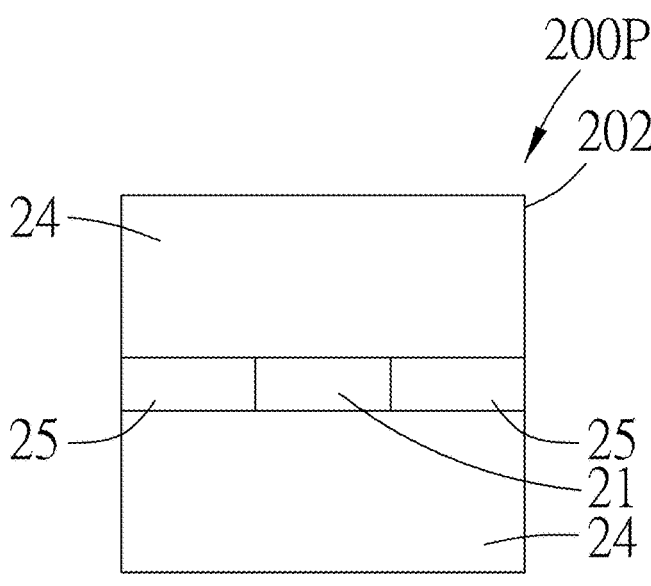
Figure 7B:
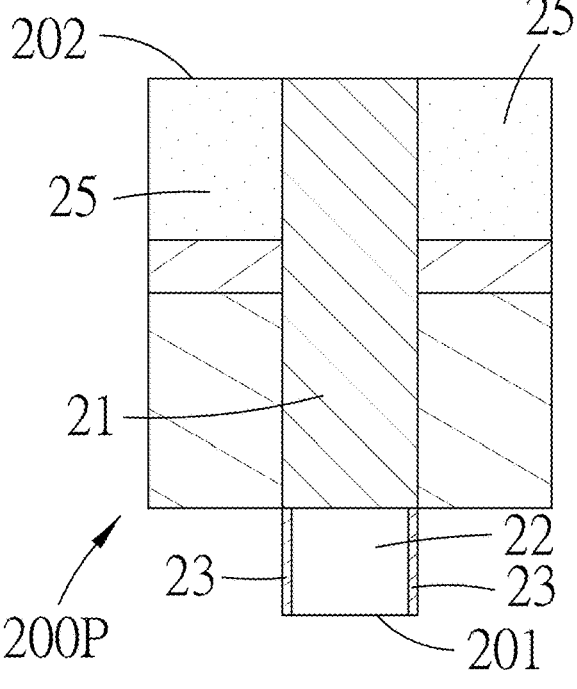
Figure 7C:
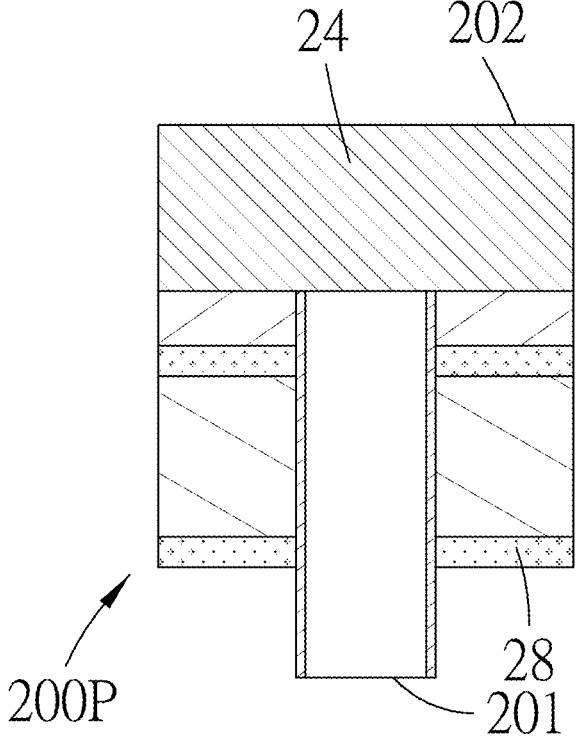
Figure 7D:
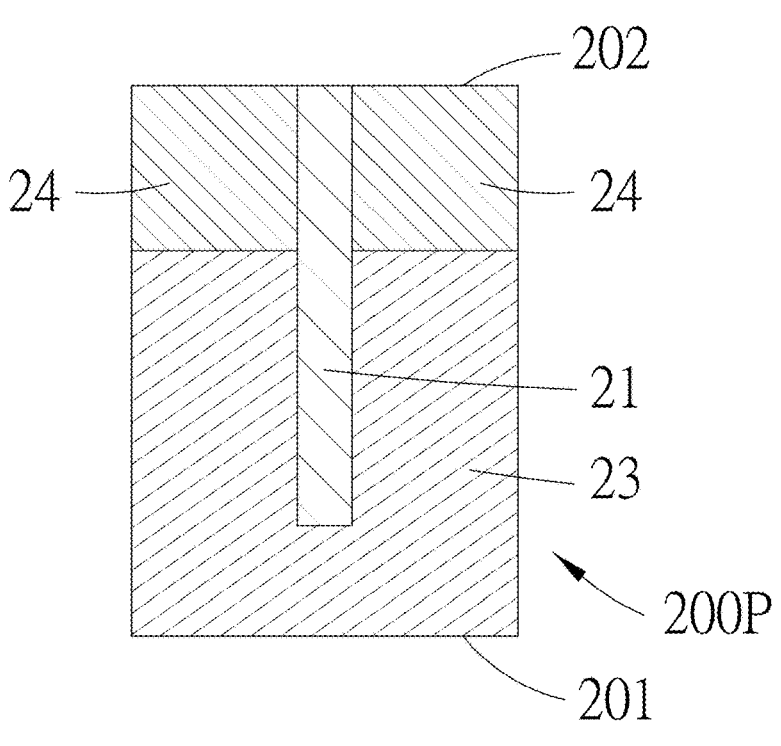
Figure 7E:
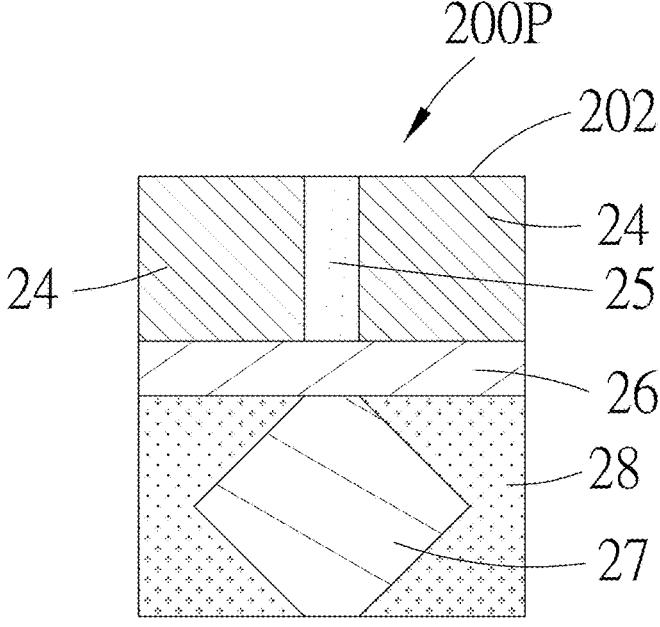
Figure 8A:
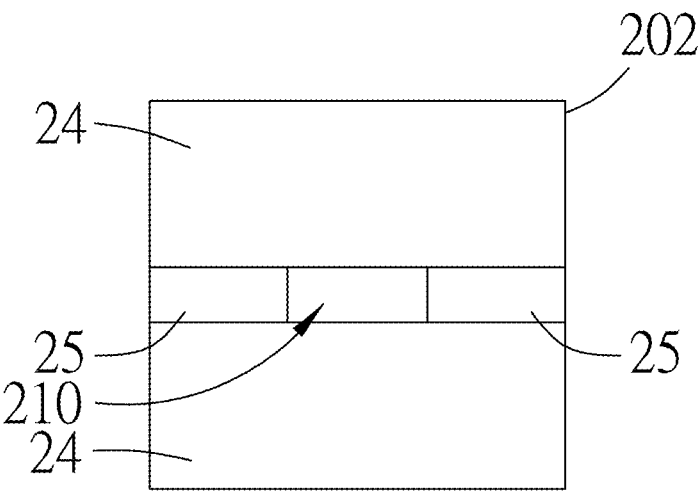
Figure 8B:
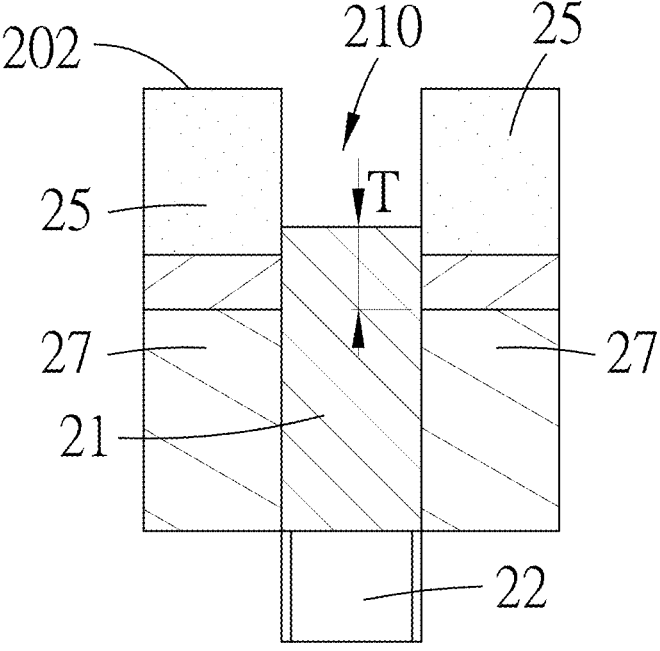
Figure 8C:
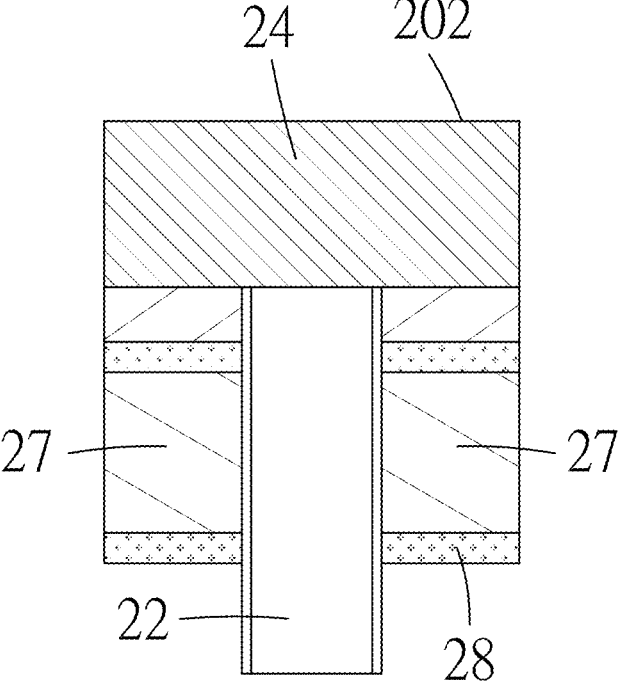
Figure 8D:
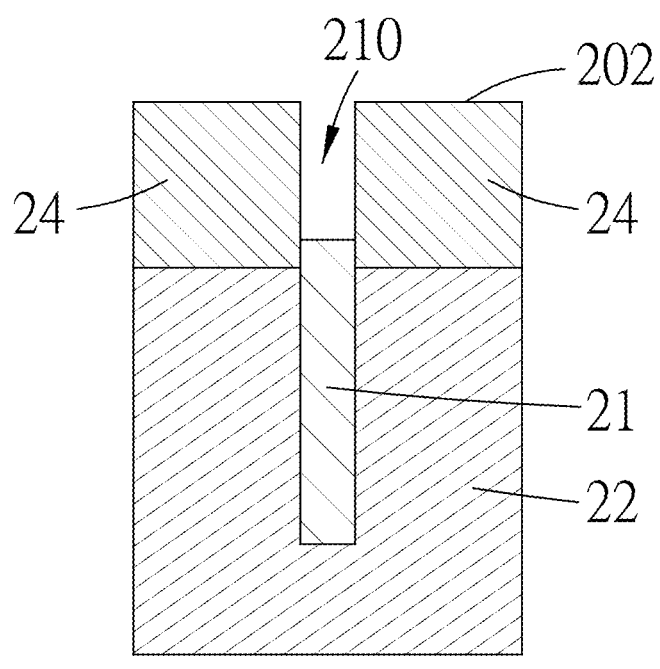
Figure 8E:
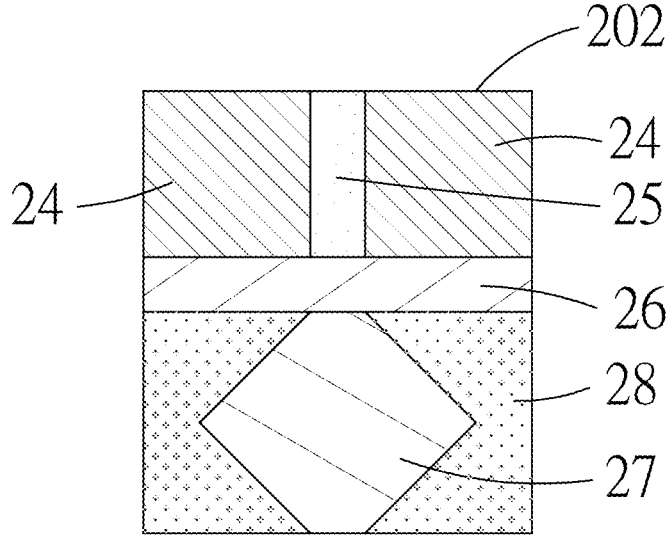
Figure 9A:
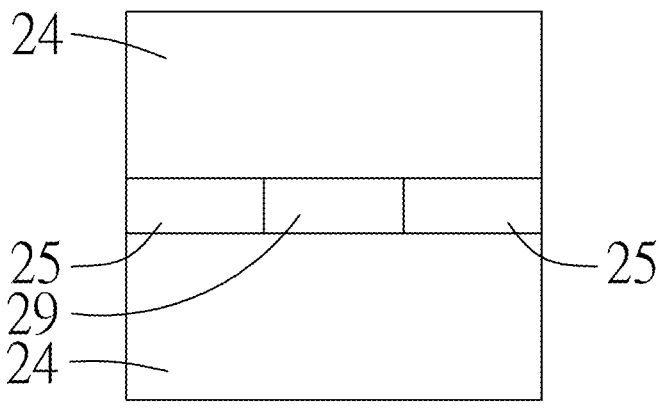
Figure 9B:
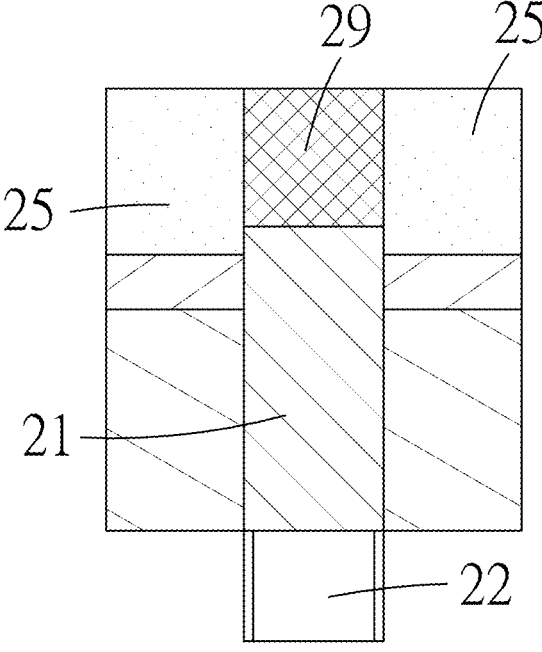
Figure 9C:
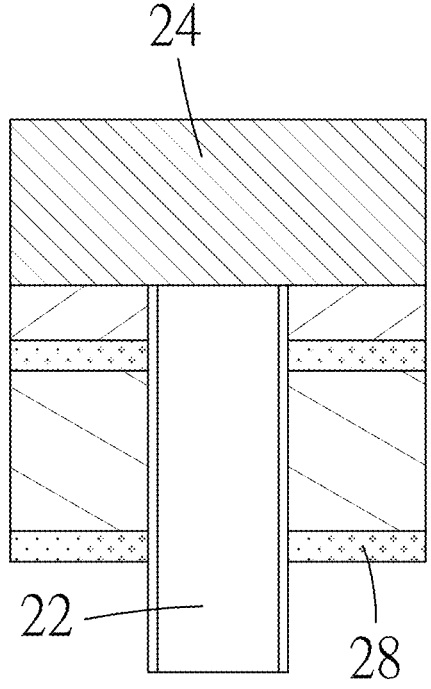
Figure 9D:
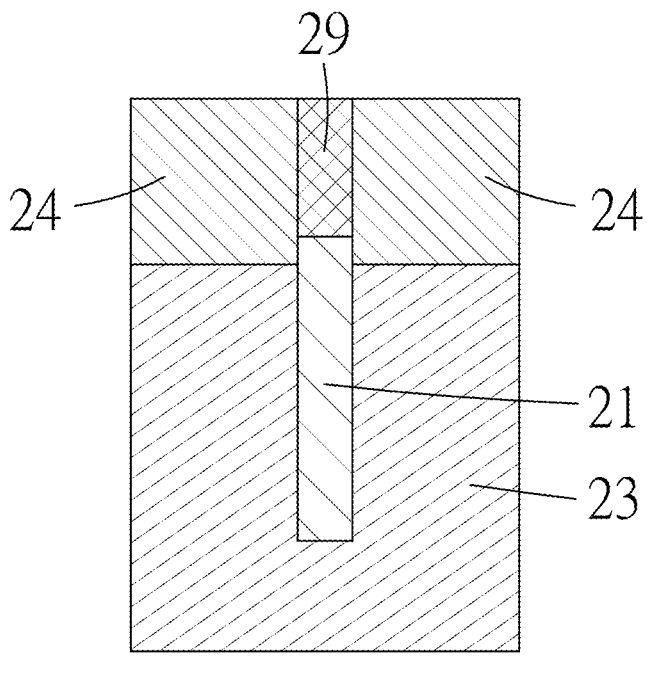
Figure 9E:
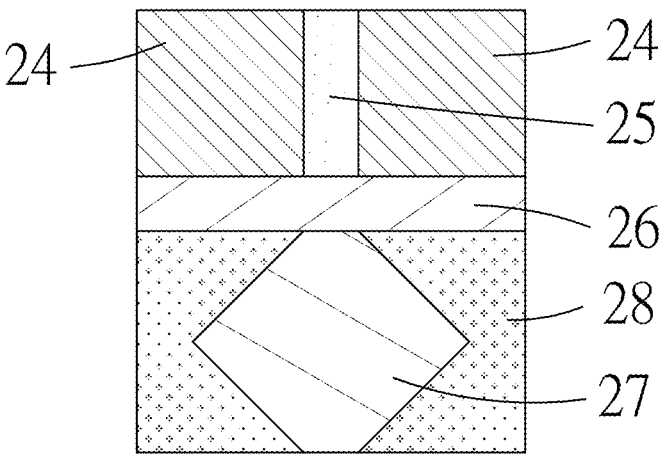
Figure 10A:
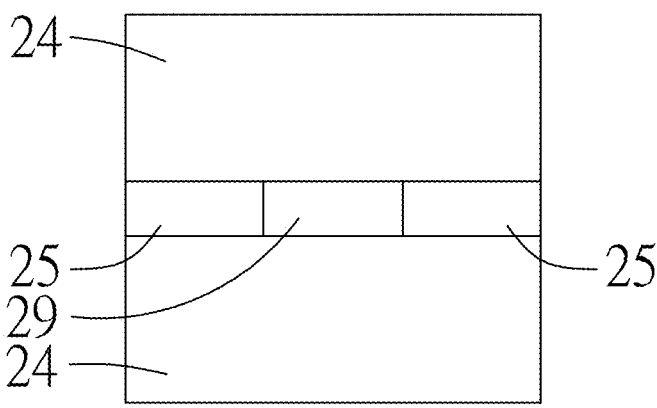
Figure 10B:
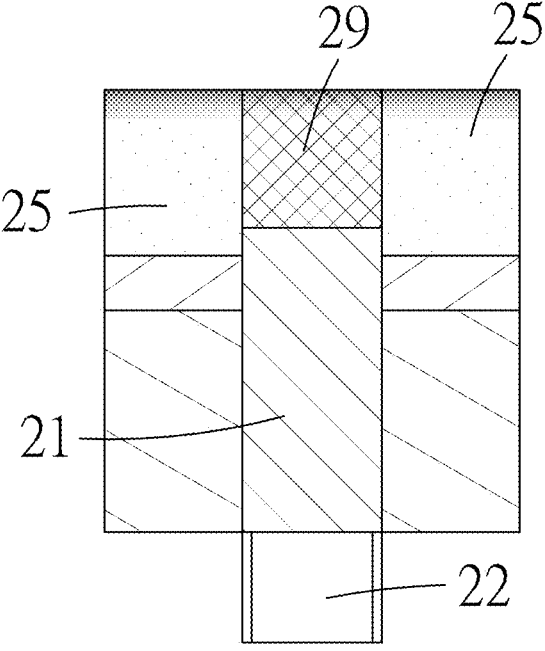
Figure 10C:
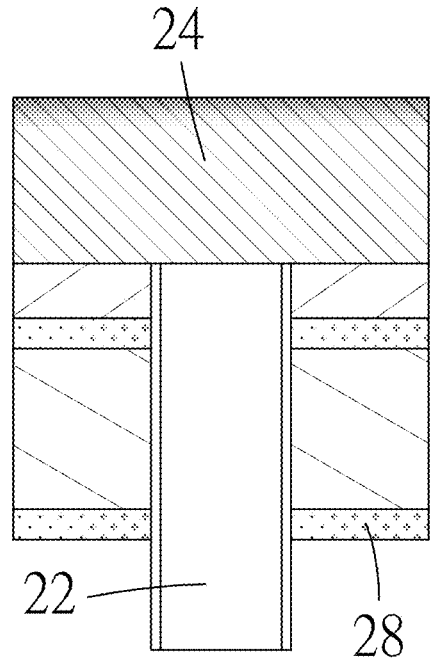
Figure 11A:
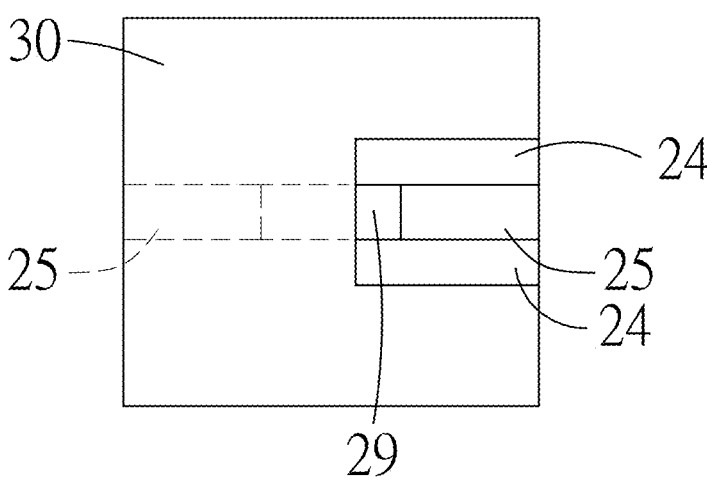
Figure 11B:
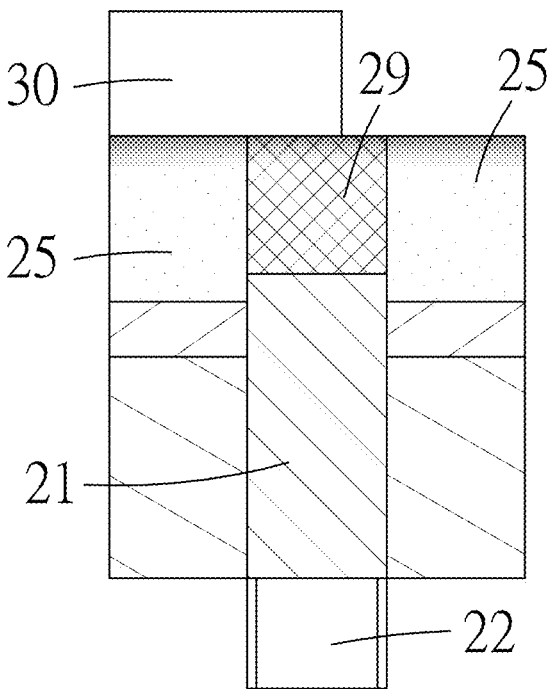
Figure 11C:
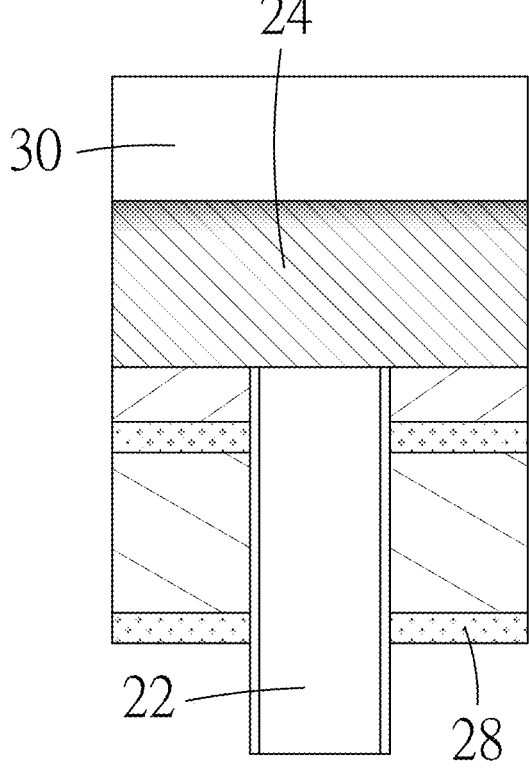
Figure 11D:
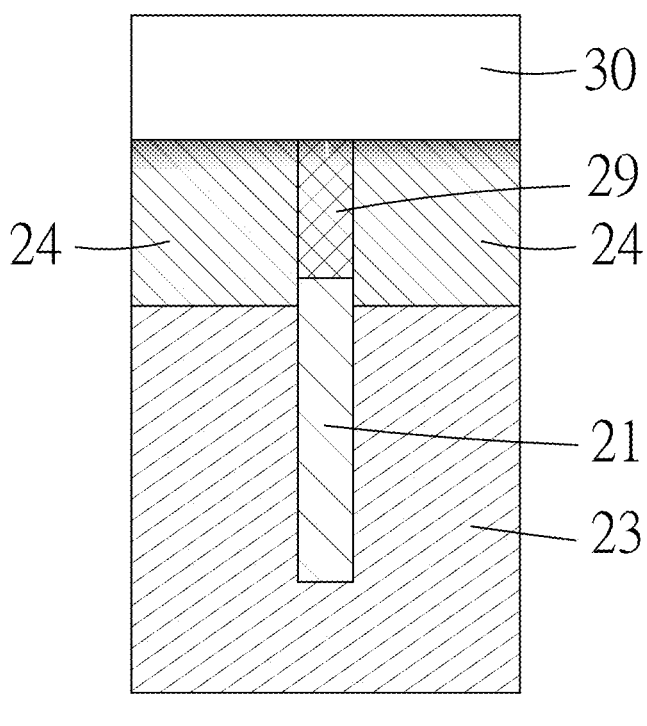
Figure 11E:
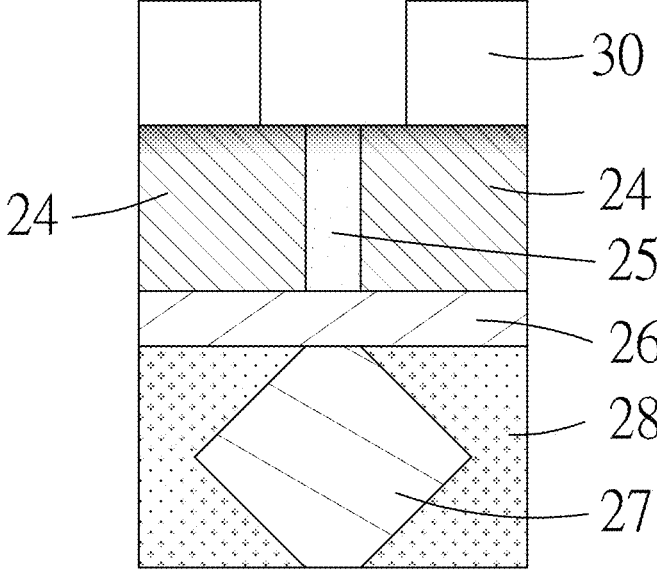
Figure 12A:
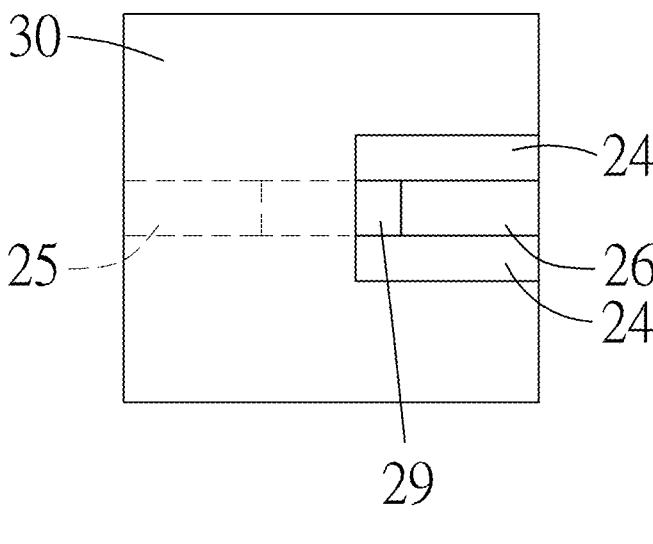
Figure 12B:
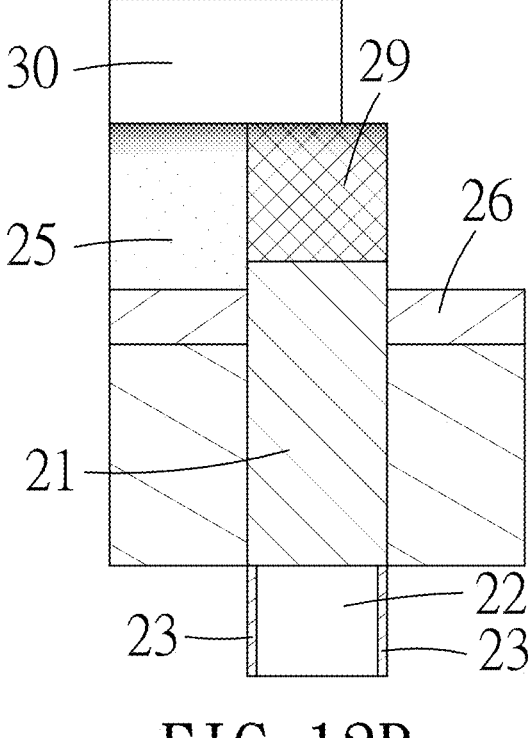
Figure 12C:
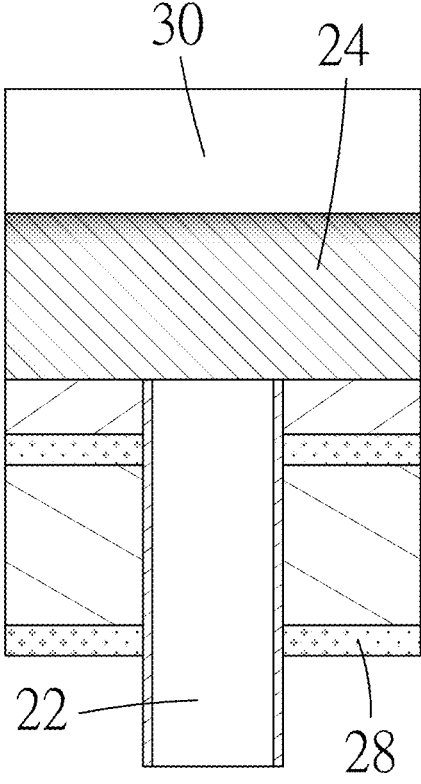
Figures 12D, 12E:
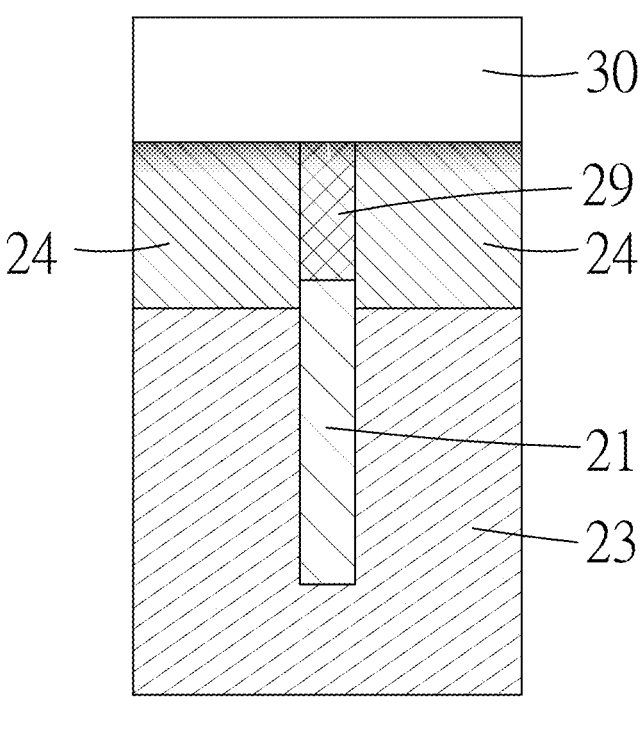
Figure 13A:
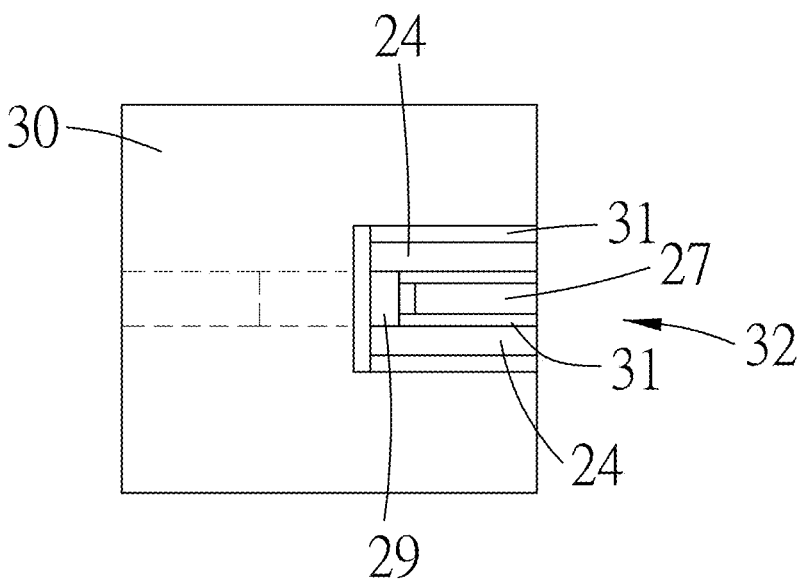
Figure 13B:
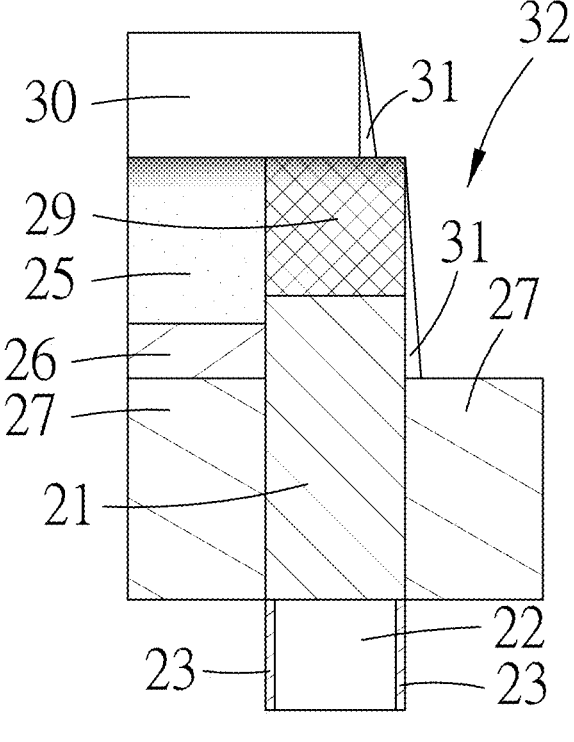
Figure 13C:
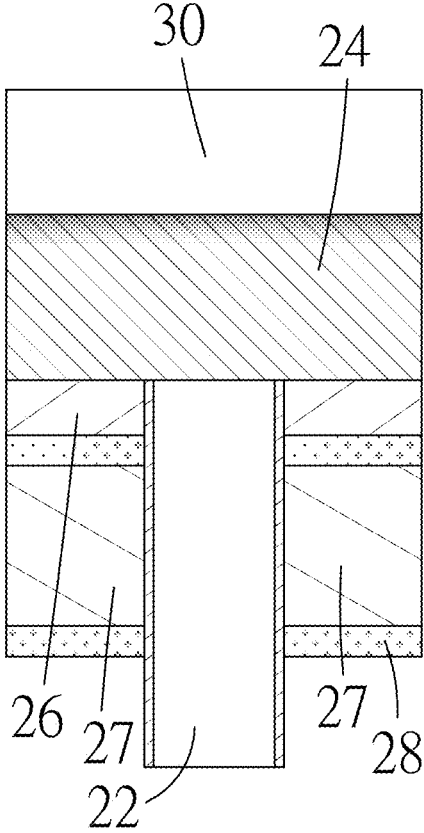
Figure 13D:
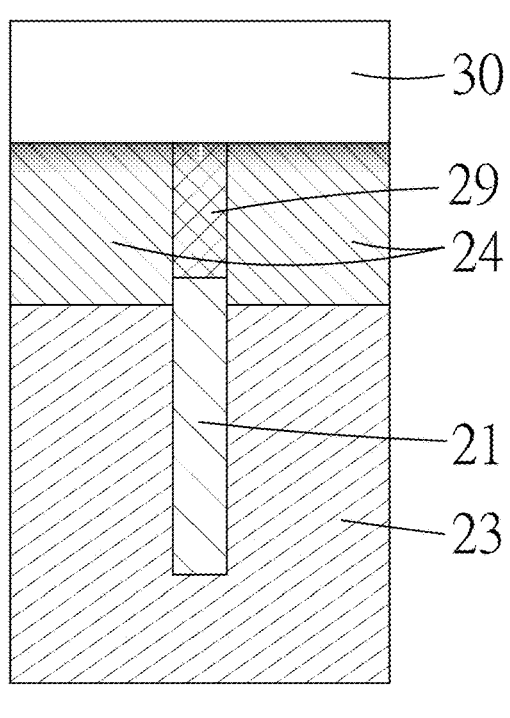
Figure 13E:
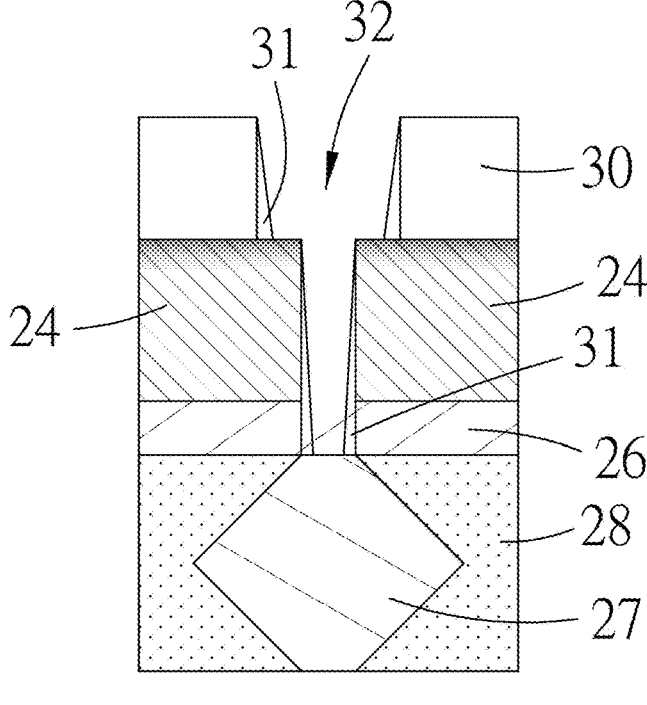
Figure 14A:
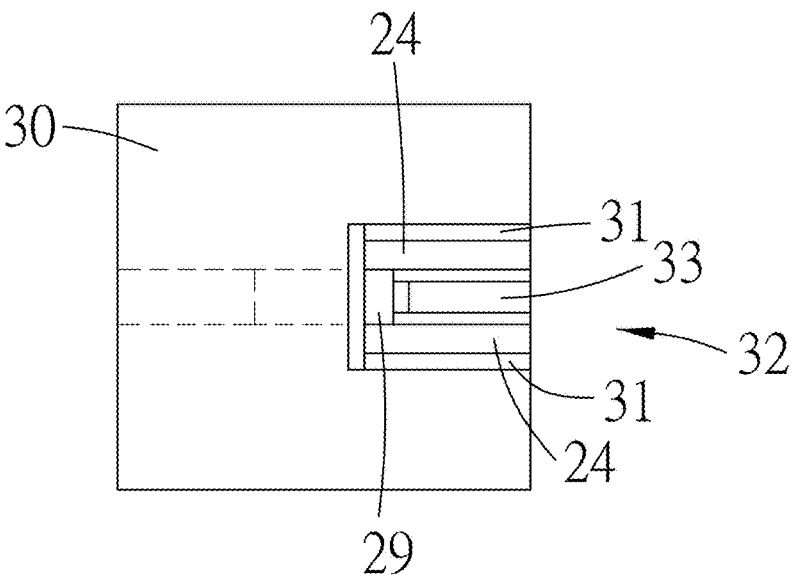
Figure 14B:
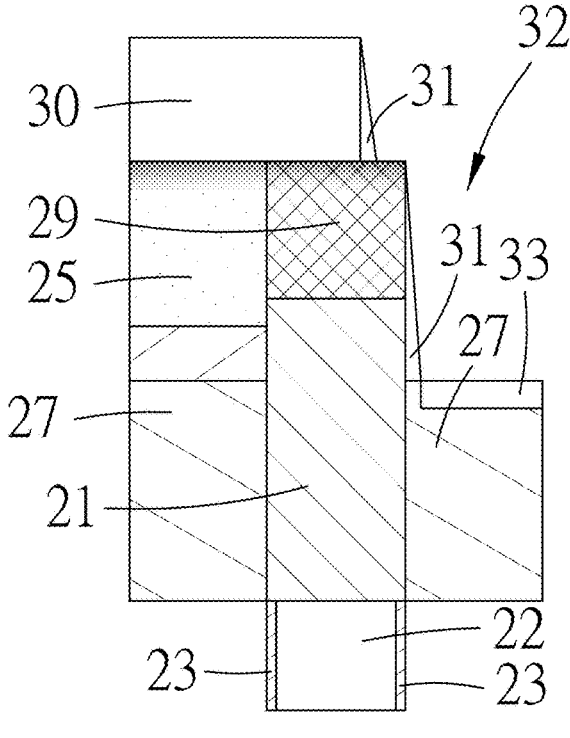
Figure 14C:
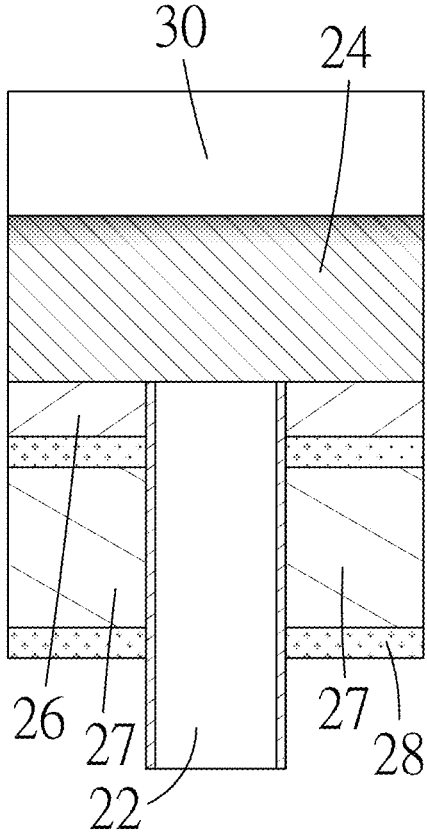
Figure 14D:
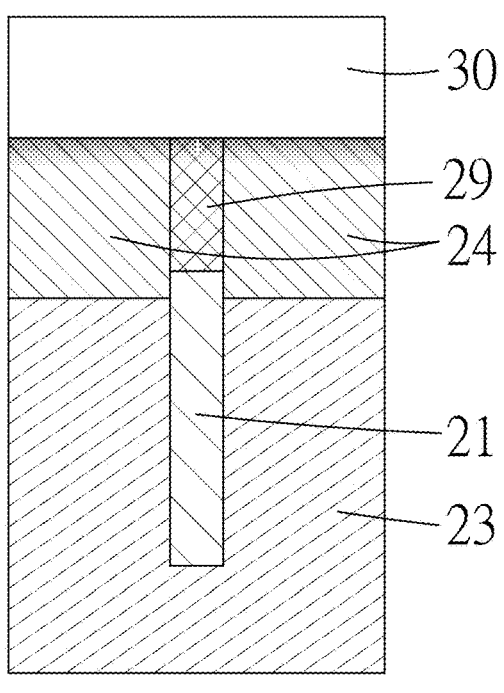
Figure 14E:
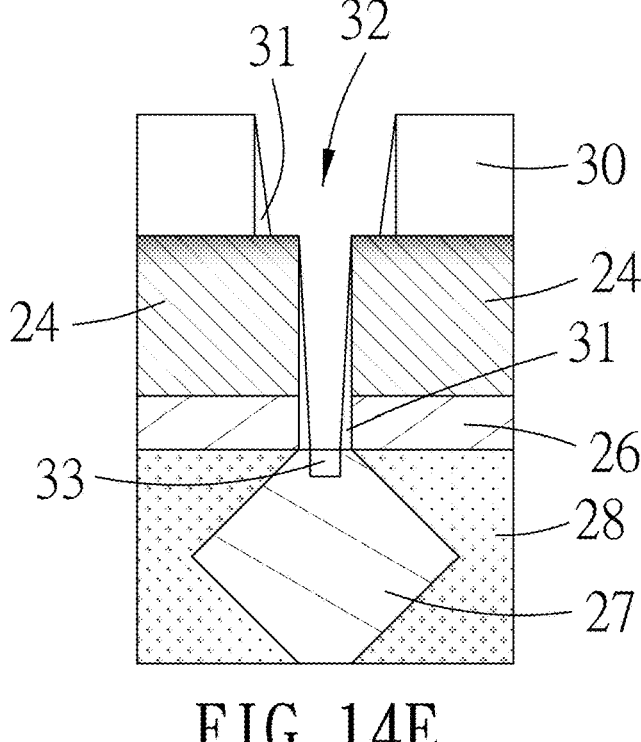

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device in which an implantation process is introduced to enhance etch resistance of a backside self-aligned contact (SAC) layer so as to prevent or mitigate etching of the backside SAC layer by a pre-silicide cleaning process that is to be performed before formation of a backside silicide layer, and a method for manufacturing the same. The semiconductor device may be applied to a metal-oxide-semiconductor field effect transistor (MOSFET), such as a planar MOSFET, a fin-type FET (FinFET), a gate-all-around (GAA) nanosheet FET, a GAA nanowire FET, or other suitable devices.

A backside SAC layer is formed on a semiconductor fin from a back side of the semiconductor device to protect the semiconductor fin during subsequent etching processes. For enhancing the etch resistance of the backside SAC layer, an implantation process is performed to modify a dielectric property of the backside SAC layer, so as to prevent or to reduce loss of the backside SAC layer during the pre-silicide cleaning process.

FIG. 1 is a flow diagram illustrating a method 100 for manufacturing the semiconductor device in accordance with some embodiments where the implantation process is performed before formation of a hard mask. FIGS. 2A-2E to 16A-16E illustrate schematic views of a semiconductor device at some intermediate stages of the method 100 in accordance with some embodiments. Additional steps can be provided before, after or during the method 100, and some of the steps described herein may be replaced by other steps or be eliminated. Similarly, further additional features may be present in the semiconductor device, and/or features present may be replaced or eliminated in additional embodiments.

Referring to FIG. 1 and the example illustrated in FIGS. 2A to 2E, the method 100 begins at step 102, where a semiconductor structure is formed. FIG. 2A is a top view of a semiconductor structure 200 in accordance with some embodiments. FIGS. 2B to 2E are cross-sectional views taken along lines B-B, C-C, D-D and E-E of FIG. 2A, respectively. The semiconductor structure 200 includes a semiconductor substrate 20, a semiconductor fin 21, a dummy gate portion 22, two gate spacers 23, and a plurality of isolation portions 24.

The semiconductor substrate 20 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the semiconductor substrate 20 may be doped with p-type impurities or n-type impurities, or undoped. In addition, the semiconductor substrate 20 may be a bulk silicon substrate, a silicon-on-insulator (SOI) substrate, or a germanium-on-insulator (GOI) substrate. Other suitable materials for the semiconductor substrate 20 are within the contemplated scope of the present disclosure.

The semiconductor fin 21 is formed on the semiconductor substrate 20, and may be made from a material that is the same or different from that of the semiconductor substrate 20. Since suitable materials for the semiconductor fin 21 are similar to those for the semiconductor substrate 20, the details thereof are omitted for the sake of brevity. In some embodiments, the semiconductor fin 21 extends in an X direction, and the dummy gate portion 22 extends in a Y direction transverse to the X direction. Although only one semiconductor fin 21 is shown in FIG. 2A, the number of the semiconductor fin(s) 21 can be varied according to the layout design of the semiconductor structure 200.

The isolation portions 24 are formed on the semiconductor substrate 20 beside the semiconductor fin 21, so as to isolate the semiconductor fin 21 from other semiconductor fins (not shown). The isolation portions 24 may each be a portion of a shallow trench isolation (STI), a deep trench isolation (DTI), or other suitable structures, and may be made of an oxide material (for example, silicon oxide), a nitride material (for example, silicon nitride), or a combination thereof. Other suitable materials for the isolation portions 24 are within the contemplated scope of the present disclosure.

The dummy gate portion 22 is formed over the semiconductor fin 21. In some embodiments, the dummy gate portion 22 may include a hard mask (not shown), a dummy gate (not shown) formed beneath the hard mask, and a dummy gate dielectric (not shown) formed beneath the dummy gate to separate the dummy gate from the semiconductor fin 21. In some embodiments, the hard mask may include silicon nitride, silicon oxide, silicon oxynitride, or combinations thereof; the dummy gate may include polycrystalline silicon, single crystalline silicon, amorphous silicon, or combinations thereof; and the dummy gate dielectric may include silicon oxide, silicon nitride, silicon oxynitride, high dielectric constant (k) materials, or combinations thereof. Other suitable materials for the dummy gate portion 22 are within the contemplated scope of the present disclosure.

The gate spacers 23 are formed at two opposite sides of the dummy gate portion 22. Each of the gate spacers 23 may include silicon oxide, silicon nitride, or a combination thereof. Other suitable materials for the gate spacers 23 are within the contemplated scope of the present disclosure.

In some embodiments, the semiconductor structure 200 may be formed by (i) patterning the semiconductor substrate 20 to form the semiconductor fin 21, (ii) forming an isolation layer over the semiconductor substrate 20 and the semiconductor fin 21, followed by a planarization process, for example, but not limited to, chemical mechanical polishing (CMP), to form the isolation portions 24, (iii) recessing the isolation portions 24 to expose an upper portion of the semiconductor fin 21, (iv) forming the dummy gate portion 22 over the semiconductor fin 21 such that the semiconductor fin 21 has two portions exposed from and located on two opposite sides of the dummy gate portion 22, and (v) forming the two gate spacers 23 at two opposite sides of the dummy gate portion 22. Other suitable processes for forming the semiconductor structure 200 are within the contemplated scope of the present disclosure. For example, the semiconductor fin 21 may be formed by depositing a semiconductor layer on the semiconductor substrate 20, followed by patterning the semiconductor layer, and may be made of a material different from that of the semiconductor substrate 20.

Referring to FIG. 1 and the example illustrated in FIGS. 3A to 3E, the method 100 then proceeds to step 104, where fin portions of the semiconductor fin exposed from the dummy gate portions and the gate spacers are recessed. FIGS. 3A to 3E are views similar to FIGS. 2A to 2E, respectively, but illustrating the structure after step 104. The fin portions of the semiconductor fin 21 that are exposed from the dummy gate portion 22 and the gate spacers 23 and that are and located on two opposite sides of the dummy gate portion 22 are recessed to form the recessed fin portions 211. Step 104 may be implemented by etching the semiconductor fin 21 not covered by the dummy portion 22 or the gate spacers 23 through a known etching process in the art, such as, but not limited to, a dry etching process, a wet etching process, other suitable processes, or combinations thereof. The etching process may be anisotropic, and hence a portion of the semiconductor fin 21 that is directly beneath the dummy gate portion 22 and the gate spacers 23 are protected from being etched. Top surfaces of the fin portions of the semiconductor fin 21 that are etched to form the recessed fin portions 211 are lower than top surfaces of the isolation portions 24 in some embodiments, but may be flush with or higher than the top surfaces of the isolation portions 24 in other embodiments.

Referring to FIG. 1 and the example illustrated in FIGS. 4A to 4E, the method 100 then proceeds to step 106, where dummy epitaxial portions are formed in the recessed fin portions. FIGS. 4A to 4E are views similar to FIGS. 2A to 2E, respectively, but illustrating the structure after step 106. Two dummy epitaxial portions 25 are formed at two opposite sides of the semiconductor fin 21. The dummy epitaxial portions 25 may include silicon, silicon germanium, silicon carbide, germanium, III-V compound semiconductors, or combinations thereof. Other suitable materials for the dummy epitaxial portions 25 are within the contemplated scope of the present disclosure. In some embodiments, the dummy epitaxial portions 25 include silicon germanium (SiGe). An atomic concentration of Ge in the dummy epitaxial portions 25 may range from about 5% to about 50%. In some embodiments, the dummy epitaxial portions 25 may be formed by an epitaxial growth technique from bottoms of the recessed fin portions 211 (see FIGS. 3A, 3B and 3E). In some embodiments, top surfaces of the dummy epitaxial portions 25 are flush with top surfaces of the isolation portions 24. In some embodiments, each of the dummy epitaxial portions 25 has a width (along a gate direction in which the dummy gate portion 22 extends, namely the Y direction) ranging from about 5 nm to about 30 nm.

Referring to FIG. 1 and the example illustrated in FIGS. 5A to 5E, the method 100 then proceeds to step 108, where a coverage dielectric layer is formed to cover the dummy epitaxial portions. FIGS. 5A to 5E are views similar to FIGS. 2A to 2E, respectively, but illustrating the structure after step 108. A coverage dielectric layer 26 is formed on the isolation portions 24 and the dummy epitaxial portions 25, and is disposed beside the dummy gate portion 22, so that the dummy epitaxial portions 25 are covered by the coverage dielectric layer 26. In some embodiments, the coverage dielectric layer 26 is formed by a deposition process through a patterned hard mask (not shown). In some embodiments, the coverage dielectric layer 26 may be formed by a blanket deposition process, such as, but not limited to, chemical vapor deposition (CVD), high density plasma CVD (HDPCVD), sub-atmospheric CVD (SACVD) or molecular layer deposition (MLD), or physical vapor deposition (PVD). In some embodiments, the coverage dielectric layer 26 includes a dielectric material such as, but not limited to, silicon oxide (SiO), aluminum oxide (AlO), zirconium oxide (ZrO), hafnium oxide (HfO), silicon nitride (SiN), silicon carbon nitride (SiCN), silicon oxycarbonnitride (SiOCN), other suitable materials, or combinations thereof. The coverage dielectric layer 26 has a thickness ranging from about 1 nanometer (nm) to about 10 nm.

Referring to FIG. 1 and the example illustrated in FIGS. 6A to 6E, the method 100 then proceeds to step 110, where epitaxial regions are formed on the semiconductor fin over the dummy epitaxial portions. FIGS. 6A to 6E are views similar to FIGS. 2A to 2E, respectively, but illustrating the structure after step 110. Epitaxial regions 27 are formed by an epitaxial growth technique from lateral sides of the semiconductor fin 21, correspond in position to the dummy epitaxial portions 25, and are spaced apart from the dummy epitaxial portions 25 by the coverage dielectric layer 26. In some embodiments, the epitaxial regions are source/drain regions of a transistor. It is noted that each of the source/drain regions may refer to a source or a drain, individually or collectively depending upon the context. In some embodiments, each of the epitaxial regions 27 may be a semiconductor epitaxial region doped with an n-type impurity, for example, but not limited to, phosphorus. The semiconductor epitaxial regions 27 may include silicon, silicon germanium, silicon carbide, germanium, II-V compound semiconductors, or combinations thereof. Other suitable materials for the epitaxial regions 27 are within the contemplated scope of the present disclosure. In some embodiments, each of the epitaxial regions 27 may be a semiconductor epitaxial region doped with a p-type impurity, for example, but not limited to, boron. The semiconductor epitaxial regions 27 may include silicon, silicon germanium, silicon carbide, germanium, III-V compound semiconductors, or combinations thereof. Other suitable materials for the epitaxial regions 27 are within the contemplated scope of the present disclosure.

Referring to FIG. 1 and the example illustrated in FIGS. 7A to 7E, the method 100 then proceeds to step 112, where an interlayer dielectric (ILD) layer is formed on the coverage dielectric layer and surrounds the epitaxial regions, the structure formed with the ILD layer is flipped upside down, and the semiconductor substrate is removed. FIGS. 7A to 7E are views of the structure shown in FIGS. 6A to 6E when flipped upside down, but further illustrating the structure after step 112. FIGS. 7B to 7E are cross-sectional views taken along lines B-B, C-C, D-D and E-E of FIG. 7A, respectively. A contact etch stop layer (CESL, not shown) and an interlayer dielectric (ILD) layer 28 are sequentially formed over the structure shown in FIGS. 6A to 6E. In some embodiments, the CESL and the ILD layer 28 are sequentially formed using a blanket deposition process, such as, but not limited to, CVD, HDPCVD, SACVD, or MLD. Other suitable processes for forming the CESL and the ILD layer 28 are within the contemplated scope of the present disclosure. In some embodiments, the CESL includes, for example, but not limited to, silicon nitride, carbon-doped silicon nitride, or combinations thereof. The ILD layer 28 includes a dielectric material such as, but not limited to, silicon oxide, silicon nitride, silicon oxynitride, or combinations thereof. Other suitable materials for forming the CESL and the ILD layer 28 are within the contemplated scope of the present disclosure.

In some embodiments, the dummy gate portion 22 is maintained at this stage. In some embodiments, a replacement gate (RPG) process may be performed to replace the dummy gate portion 22 (i.e., the hard mask, the dummy gate and the dummy gate dielectric) with a gate portion (not shown) that may include a gate electrode and a gate dielectric. In some embodiments, the RPG process includes (i) removing the hard mask, the dummy gate and the dummy gate dielectric to form a trench using dry etching, wet etching, other suitable processes, or combinations thereof, (ii) sequentially depositing layers of the gate dielectric and the gate electrode to fill the trench by a blanket deposition process, such as CVD, HDPCVD, SACVD, MLD, or PVD, and (iii) performing a planarization process, for example, but not limited to, CMP, to remove excesses of the gate electrode and the gate dielectric. Other suitable processes for forming the gate portion are within the contemplated scope of the present disclosure. In some embodiments, the gate dielectric includes silicon oxide, silicon nitride, silicon oxynitride, high-k materials, other suitable materials, or combinations thereof, and the gate electrode includes aluminum, tungsten, copper, other suitable materials, or combinations thereof. Other suitable materials for forming the gate portion are within the contemplated scope of the present disclosure.

Subsequently, a carrier substrate (not shown) is first attached to a front-side surface 201 of the structure formed with the ILD layer 28. The front-side surface 201 is opposite to the semiconductor substrate 20 (see FIGS. 6B to 6E). The structure formed with the ILD layer 28 is then flipped upside down by the carrier substrate. Next, the semiconductor substrate 20 is removed by a planarization process, for example, but not limited to, CMP, to expose the semiconductor fin 21, the dummy epitaxial portions 25 and the isolation portions 24, such that a backside-polished semiconductor structure 200P having a backside surface 202 opposite to the front-side surface 201 is formed.

Referring to FIG. 1 and the example illustrated in FIGS. 8A to 8E, the method 100 then proceeds to step 114, where the semiconductor fin is recessed to form a fin recess. FIGS. 8A to 8E are views similar to FIGS. 7A to 7E, respectively, but illustrating the structure after step 114. The semiconductor fin 21 is recessed from the backside surface 202 through an etch-back process to form a fin recess 210. The etch-back process may be implemented by, for example, but not limited to, a dry etching process, a wet etching process, other suitable processes, or combinations thereof. In some embodiments, the etch-back process has an etch rate of silicon higher than an etch rate of silicon germanium. In some embodiments, the etch-back process is performed using an etchant that attacks the semiconductor fin 21, but does not attack the isolation portions 24 and the dummy epitaxial portions 25. In some embodiments, the etchant may be implemented by for example, but not limited to, a hydrogen plasma etchant. In some embodiments, a distance T between a bottom surface (from the perspective of FIG. 8B) of the fin recess 210 and one of the epitaxial regions 27 is greater than 0 nm and has an upper limit of about 20 nm.

Referring to FIG. 1 and the example illustrated in FIGS. 9A to 9E, the method 100 then proceeds to step 116, where a SAC layer is formed in the fin recess. FIGS. 9A to 9E are views similar to FIGS. 7A to 7E, respectively, but illustrating the structure after step 116. In some embodiments, a SAC film (not shown) is first formed on the isolation portions 24, and fills in the fin recess 210 (see FIGS. 8A, 8B and 8D) of the semiconductor fin 21, and a planarization process is then conducted to remove the excess of the SAC film on the isolation portions 24 outside the fin recess 210, so as to obtain a SAC layer 29 in the fin recess 210 and on the semiconductor fin 21. In some embodiments, the SAC film may include a material that includes, for example, but not limited to, SiO, SiOC, silicon dioxide ($SiO_2$), AlO, ZrO, HfO, SiN, SiCN, SiOCN, SiCN, SiOCN, other suitable materials, or combinations thereof. The SAC film may be conformally deposited by, for example, but not limited to, atomic layer deposition (ALD), plasma enhanced atomic layer deposition (PEALD), plasma-enhanced chemical vapor deposition (PECVD), PVD, sputtering, plating, other suitable techniques, or combinations thereof. In some embodiments, the SAC layer 29 may serve as an isolation layer or an etch-stop layer to protect the semiconductor fin 21 beneath the SAC layer 29. The SAC layer 29 may have a width (along the gate direction) ranging from about 5 nm to about 30 nm, and a height that is greater than zero and has an upper limit of about 50 nm. The planarization process of step 116 may be implemented using a CMP process or other suitable techniques. In some embodiments, a top surface (from the perspective of FIGS. 9B and 9D) of the SAC layer 29 may be coplanar with top surfaces of the isolation portions 24 and also coplanar with top surfaces of the dummy epitaxial portions 25.

Referring to FIG. 1 and the example illustrated in FIGS. 10A to 10E, the method 100 then proceeds to step 118, where an implantation process is performed on the isolation portions, the dummy epitaxial portions and the SAC layer. FIGS. 10A to 10E are views similar to FIGS. 7A to 7E, respectively, but illustrating the structure after step 118. In some embodiments, step 118 is performed by implanting at least one implantation element into an upper part (from the perspective of FIGS. 10B to 10E) of each the isolation portions 24, the dummy epitaxial portions 25 and the SAC layer 29. The first implantation process is used to modify a dielectric property of the SAC layer 29, i.e., to enhance the etch resistance of the SAC layer 29, so as to prevent or reduce etching of the SAC layer 29 during a subsequent pre-silicide cleaning process. In some embodiments, the implantation element includes carbon (C), silicon (Si), or a combination thereof (i.e., carbon and silicon). The implantation element is provided for modifying the dielectric property of the SAC layer 29, and other suitable implantation elements for modifying the dielectric property of the SAC layer 29 are within the contemplated scope of the present disclosure. In some embodiments, an implantation depth of the implantation process is greater than zero and has an upper limit of about 50 nm. In some embodiments, the upper limit of the implantation depth of the implantation process is about 10 nm. In some embodiments, the implanting energy ranges from about 0.3 keV to about 3 keV. In some embodiments, an implanting dosage is greater than zero and has an upper limit of about $3E^{22}$ atoms/cm$^3$. In addition, in some embodiments, in the implantation process, an implantation angle is greater than zero and has an upper limit of about 80 degrees. In some embodiments, the implantation process is performed at a relatively high temperature.

Referring to FIG. 1 and the example illustrated in FIGS. 11A to 11E, the method 100 then proceeds to step 120, where a hard mask is formed on the structure shown in FIGS. 10A to 10E with a patterned opening that corresponds in position to one of the dummy epitaxial portions. FIGS. 11A to 11E are views similar to FIGS. 7A to 7E, respectively, but illustrating the structure after step 120. A hard mask 30 is formed partially on the isolation portions 24, the SAC layer 29 and the dummy epitaxial portions 25, and has a patterned opening that corresponds in position to one of the dummy epitaxial portions 25 to expose parts of the isolation portions 24 (referred to as exposed isolation parts hereinafter), a part of the SAC layer 29 (referred to as an exposed SAC part hereinafter) and the one of the dummy epitaxial portions 25. In some embodiments, the hard mask 30 includes a dielectric material such as, but not limited to, SiO, SiOC, SiO2, AlO, ZrO, HfO, SiN, SiOCN, SiCN, other suitable materials, or combinations thereof. In some embodiments, the hard mask 30 may be formed by patterning a hard mask film using a photolithography process and an etching process. The photolithography process may include, for example, but not limited to, coating a photoresist, soft-baking, exposing the photoresist through a photomask, post-exposure baking, and developing the photoresist, followed by hard-baking, so as to form a patterned photoresist. The etching process may be implemented by etching the hard mask film through the patterned photoresist using, for example, but not limited to, a dry etching process, a wet etching process, other suitable processes, or combinations thereof. In some embodiments, the hard mask 30 has a thickness raging from about 5 nm to about 40 nm.

Referring to FIG. 1 and the example illustrated in FIGS. 12A to 12E, the method 100 then proceeds to step 122, where the one of the dummy epitaxial portions is removed. FIGS. 12A to 12E are views similar to FIGS. 7A to 7E, respectively, but illustrating the structure after step 122. The one of the dummy epitaxial portions 25 exposed from the patterned opening of the hard mask 30 is removed by an etching process known in the art, such as, but not limited to, a dry etching process, a wet etching process, other suitable processes, or combinations thereof. In this way, a portion of the coverage dielectric layer 26 previously covered by the one of the dummy epitaxial portions 25 is exposed.

Referring to FIG. 1 and the example illustrated in FIGS. 13A to 13E, the method 100 then proceeds to step 124, where dielectric spacers are formed on sidewalls of the hard mask and the isolation portions. FIGS. 13A to 13E are views similar to FIGS. 7A to 7E, respectively, but illustrating the structure after step 124. Before formation of dielectric spacers 31, the portion of the coverage dielectric layer 26 exposed from the patterned opening of the hard mask 30 is first removed by an etching process known in the art, such as, but not limited to, a dry etching process, a wet etching process, other suitable processes, or combinations thereof, so that a contact recess 32 is formed to extend from the hard mask 30, through the isolation portions 24 and the coverage dielectric layer 26 to reach one of the epitaxial regions 27 and to expose said one of the epitaxial regions 27, wherein said one of the epitaxial regions 27 was previously covered by the coverage dielectric 26 and beneath the one of the dummy epitaxial portions 25 (see FIGS. 11B and 11E), which was removed in step 122. The dielectric spacers 31 are then formed on sidewalls of the hard mask 30, the isolation portions 24, the coverage dielectric layer 26, the SAC layer 29 and the semiconductor fin 21 that border the contact recess 32. In some embodiments, the dielectric spacers 31 are formed of a dielectric material such as, but not limited to, SiOC, SiO, AlO, ZrO, HfO, SiN, SiOCN, SiCN, or the like. Other suitable materials for the dielectric spacers 31 are within the contemplated scope of the present disclosure. The dielectric spacers 31 may be formed through, for example, a blanket deposition process followed by an anisotropic etching process, and may each have a thickness that is greater than zero and has an upper limit of about 10 nm.

Referring to FIG. 1 and the example illustrated in FIGS. 14A to 14E, the method 100 then proceeds to step 126, where a silicide layer is formed on one of the epitaxial regions exposed from the contact recess. FIGS. 14A to 14E are views similar to FIGS. 7A to 7E, respectively, but illustrating the structure after step 126.

Figure 15:
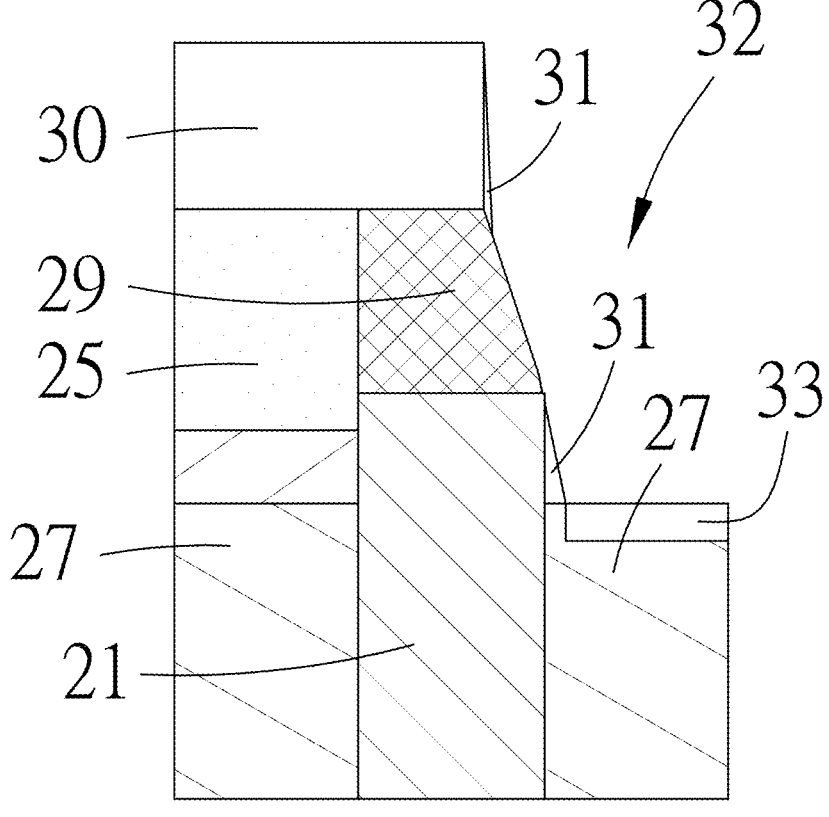
Figure 16A:
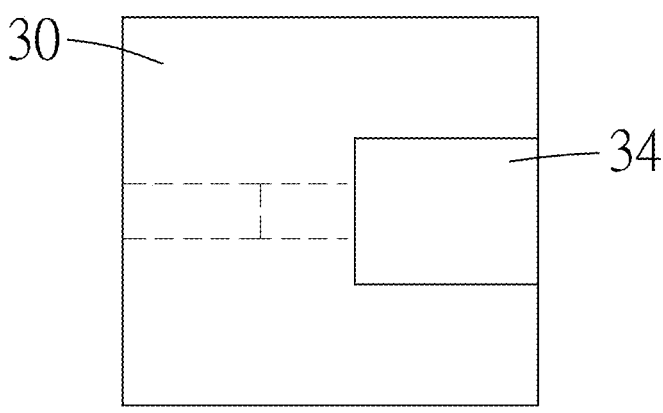
Figure 16B:
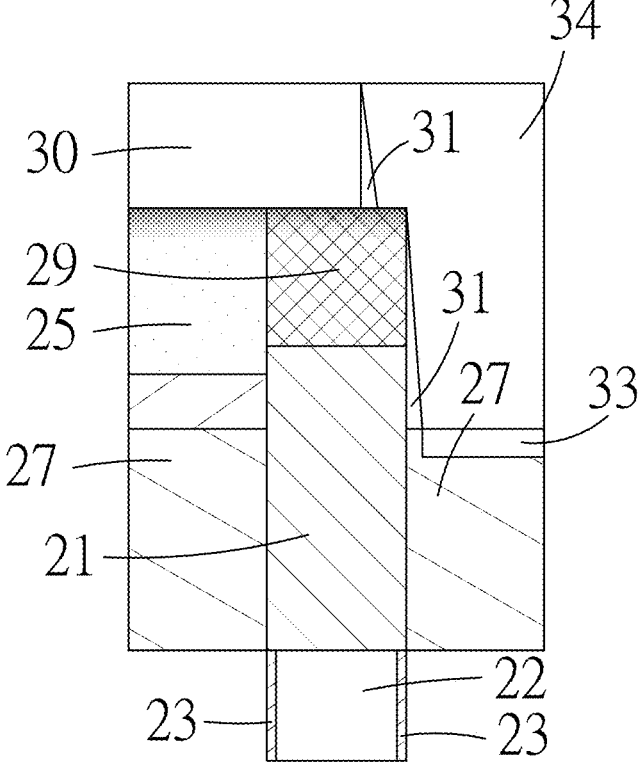
Figure 16C:
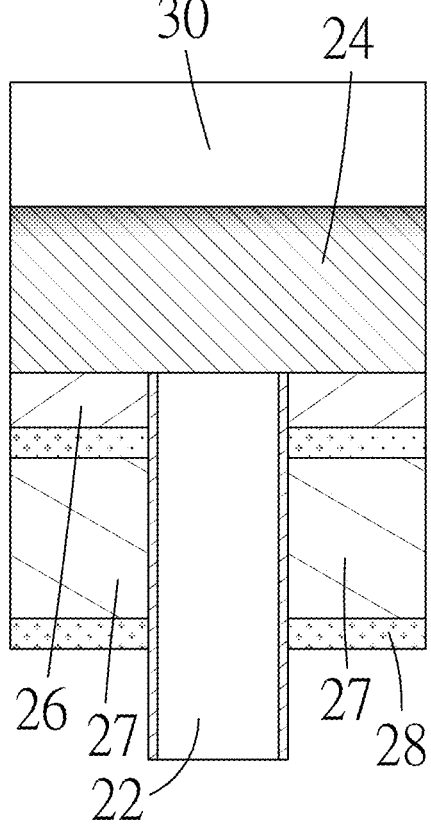
Figure 16D:
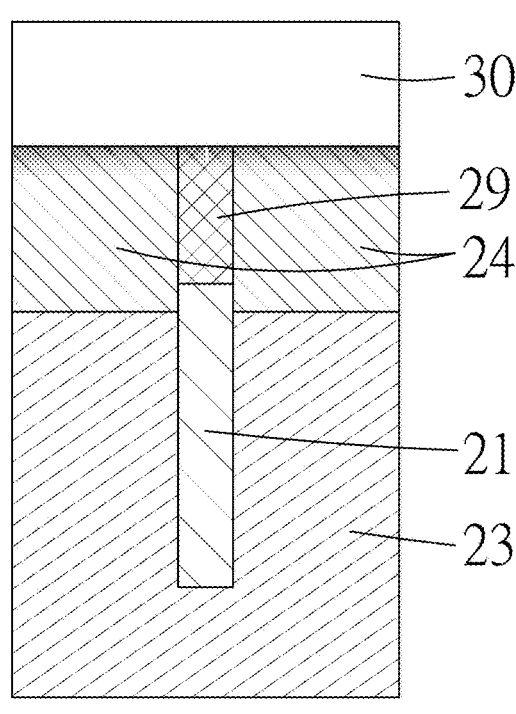
Figure 16E:
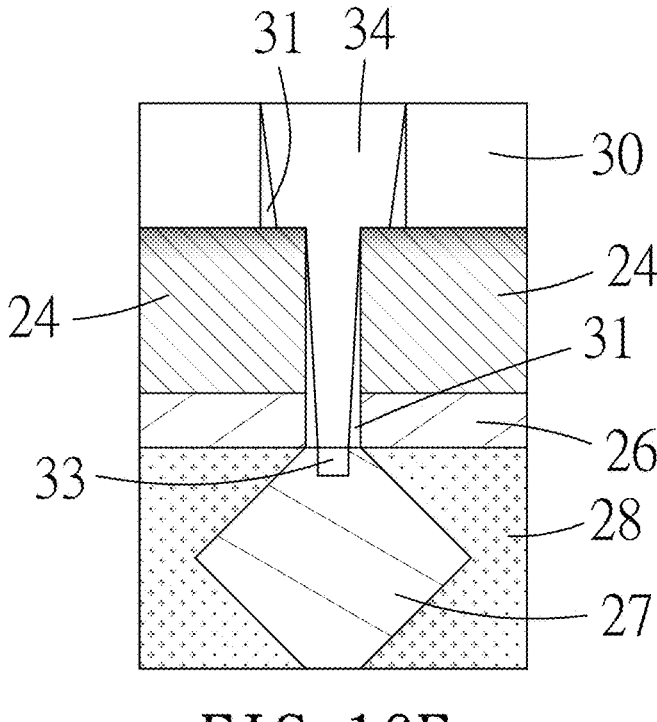

It is noted that prior to step 126 of forming a silicide layer 33, a pre-silicide cleaning process is performed to remove any undesired materials remaining on the structure shown in FIGS. 13A to 13E, such as oxides remaining in the contact recess 32. In some embodiments, the pre-silicide cleaning process may be performed using, for example, a hydrofluoric-acid-based solution, or a fluoride-containing gas. Other suitable cleaning processes are within the contemplated scope of the present disclosure. Since the etch resistance of the SAC layer 29 is enhanced by the implantation process in step 118, the SAC layer 29 may be prevented from being etched by the pre-silicide cleaning process, so that the semiconductor fin 21 may be protected by the SAC layer 29 and the dielectric spacers 31. In comparison with an embodiment where step 118 of performing an implantation process is omitted, referring to the example illustrated in FIG. 15, which is a view similar to FIG. 14B, since the etch resistance of the SAC layer 29 is not enhanced, the SAC layer 29 may be etched by the pre-silicide cleaning process, so the semiconductor fin 21 may be exposed and not protected by the SAC layer 29 and the dielectric spacers 31.

Subsequent to the pre-silicide cleaning process, the silicide layer 33 is formed on the one of the epitaxial regions 27 that is exposed from the contact recess 32. In some embodiments, the silicide layer 33 may include silicon and at least one metal element that includes, for example, but not limited to, titanium, nickel, cobalt, other suitable materials, or combinations thereof. In some embodiments, when the one of the epitaxial regions 27 is a semiconductor epitaxial region doped with an n-type impurity, the metal element of the silicide layer 33 includes titanium (Ti), chromium (Cr), tantalum (Ta), molybdenum (Mo), zirconium (Zr), hafnium (Hf), scandium (Sc), yttrium (Y), holmium (Ho), terbium (Tb), gadolinium (Gd), lutetium (Lu), dysprosium (Dy), erbium (Er), ytterbium (Yb), or combinations thereof; when the one of the epitaxial regions 27 is a semiconductor epitaxial region doped with a p-type impurity, the metal element of the silicide layer 33 includes nickel (Ni), cobalt (Co), manganese (Mn), tungsten (W), iron (Fe), rhodium (Rh), palladium (Pd), ruthenium (Ru), platinum (Pt), iridium (Ir), osmium (Os), or combinations thereof. The silicide layer 33 may be formed by first forming a metal layer that contains the aforementioned metal element on the one of the epitaxial regions 27 at a relatively low temperature (for example, but not limited to room temperature) followed by an annealing process. An unreacted portion of the metal layer (if any) is then removed. In some embodiments, the metal layer may be applied using PVD, sputtering, low pressure CVD (LPCVD), atomic layer chemical vapor deposition (ALCVD), electroless plating, other suitable methods, or combinations thereof. The annealing may be performed using thermal annealing, flash annealing, laser annealing, and the like. In some embodiments, the silicide layer 33 has a thickness ranging from about 1 nm to about 10 nm. In some embodiments, the silicide layer 33 may be formed in an upper portion of the one of the epitaxial regions 27 that is exposed from the contact recess 32.

Referring to FIG. 1 and the example illustrated in FIGS. 16A to 16E, the method 100 then proceeds to step 128, where a contact plug is formed on the silicide layer. FIGS. 16A to 16E are views similar to FIGS. 7A to 7E, respectively, but illustrating the structure after step 128. A contact plug 34 is formed in the contact recess 32 (see FIGS. 14A, 14B and 14E) and on the silicide layer 33. In some embodiments, step 128 includes (i) depositing a metal layer (not shown) over the hard mask 30 to fill the contact recess 32 shown in FIGS. 14A, 14B and 14E, and (ii) removing an excess of the metal layer using, for example, but not limited to, CMP, to expose the hard mask 30. After step 128, the remainder of the metal layer serves as the metal plug 34. In some embodiments, the metal layer deposited over the hard mask 30 has a thickness ranging from about 1 nm to about 50 nm. In some embodiments, the dielectric spacers 31 may serve as barrier layers to prevent metal ions in the metal plug 34 from diffusing into the isolation portions 24 and the semiconductor fin 21. In some embodiments, the metal plug 34 includes W, Ru, Co, Ti, Ta, Mo, Ni, copper (Cu), titanium nitride (TiN), tantalum nitride (TaN), or combinations thereof. Other suitable materials for the metal plug 34 are within the contemplated scope of the present disclosure.

Since the etch resistance of the SAC layer 29 is enhanced by the implantation process in step 116, the SAC layer 29 may be prevented from being etched by the pre-silicide cleaning process, so that the semiconductor fin 21 may be protected by the SAC layer 29 and the dielectric spacers 31. In this way, after formation of the contact plug 34, the semiconductor fin 21 would not be in electrical contact with the contact plug 34, and a short circuit between the semiconductor fin 21 and the contact plug 34 can be prevented.

In some embodiments, some steps in the method 100 may be modified, replaced, or eliminated without departure from the spirit and scope of the present disclosure. For example, after formation of the SAC layer in the fin recess (i.e., step 116), a hard mask may be formed first, followed by the implantation process. In other words, the order of steps 118 and 120 of the method 100 illustrated in FIG. 1 may be changed in such a manner that step 120 directly follows step 116, and step 118 is to be performed subsequent to step 120 and prior to step 124.

Referring to the example illustrated in FIGS. 17A to 17E, following step 116 of the method 100 and the example illustrated in FIGS. 9A to 9E, step 120 of the method 100 is performed where a hard mask is formed on the structure shown in FIGS. 9A to 9E with a patterned opening that corresponds in position to one of the dummy epitaxial portions. FIGS. 17A to 17E are views similar to FIGS. 7A to 7E, respectively, but illustrating the structure after step 120 is performed directly following step 116. In some embodiments, formation of the hard mask in this example is similar to formation of the hard mask described above with reference to FIGS. 11A to 11E, and thus the details thereof are omitted for the sake of brevity.

Figure 17A:
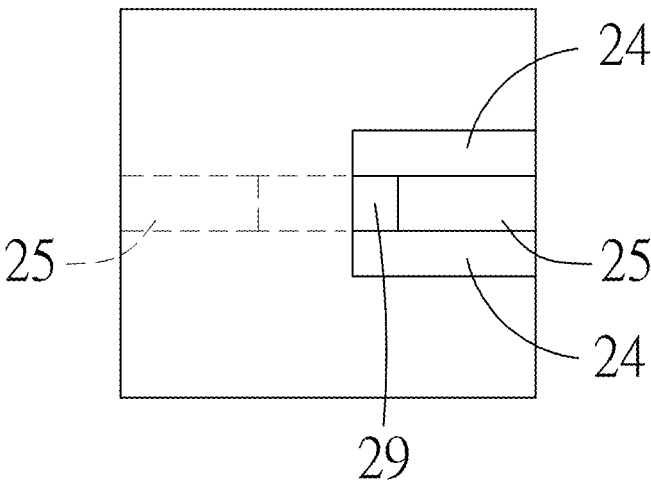
FIGS. 17A-17E to 22A-22E are schematics view illustrating some intermediate stages of a manufacturing method in accordance with some alternative embodiments.
Figure 17B:
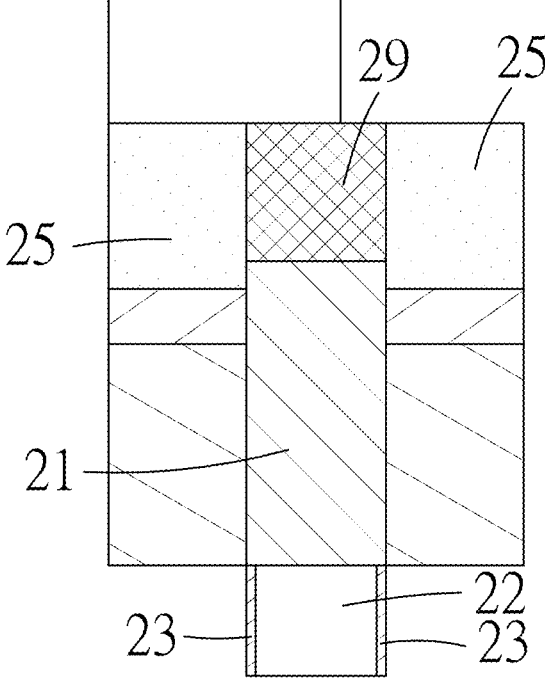
Figure 17C:
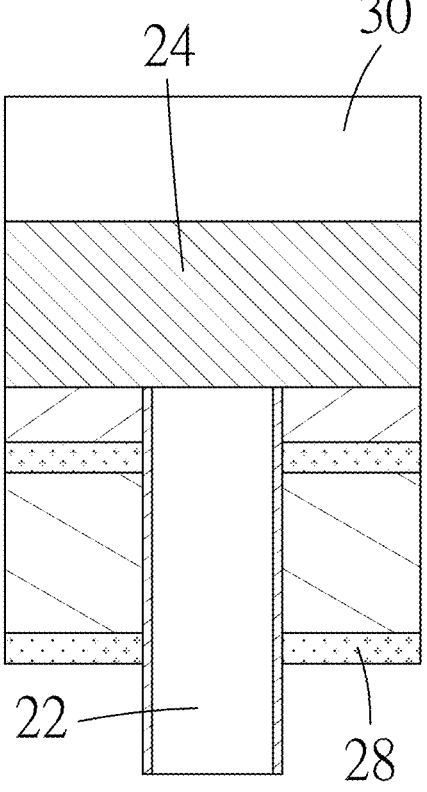
Figures 17D, 17E:
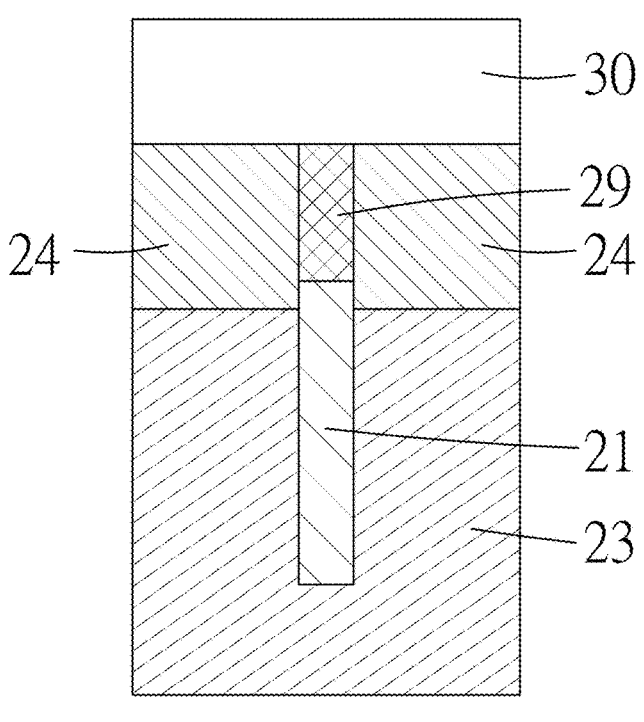
Figure 18A:
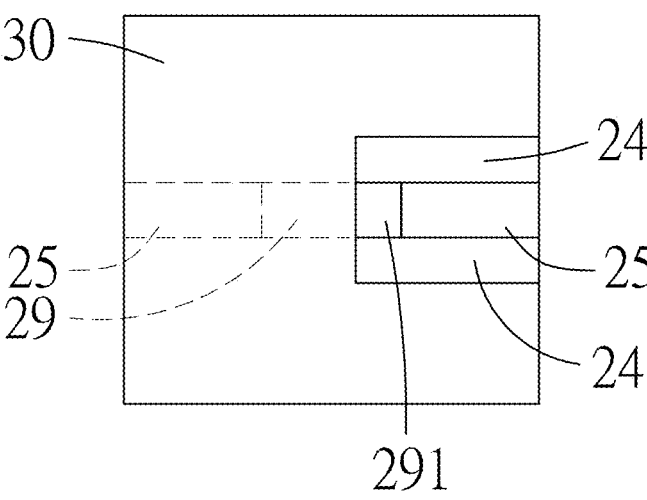
Figure 18B:
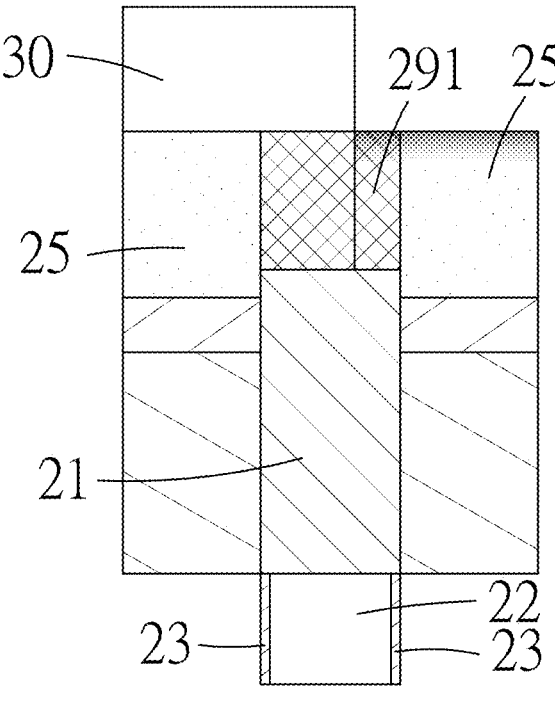
Figure 18C:
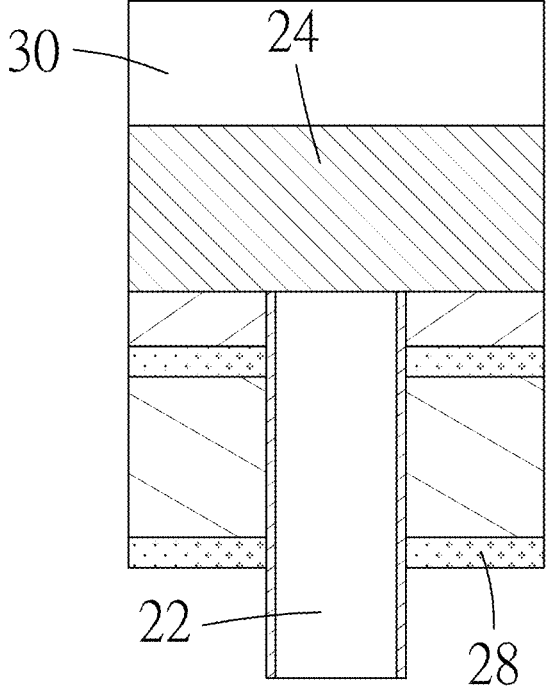
Figures 18D, 18E:
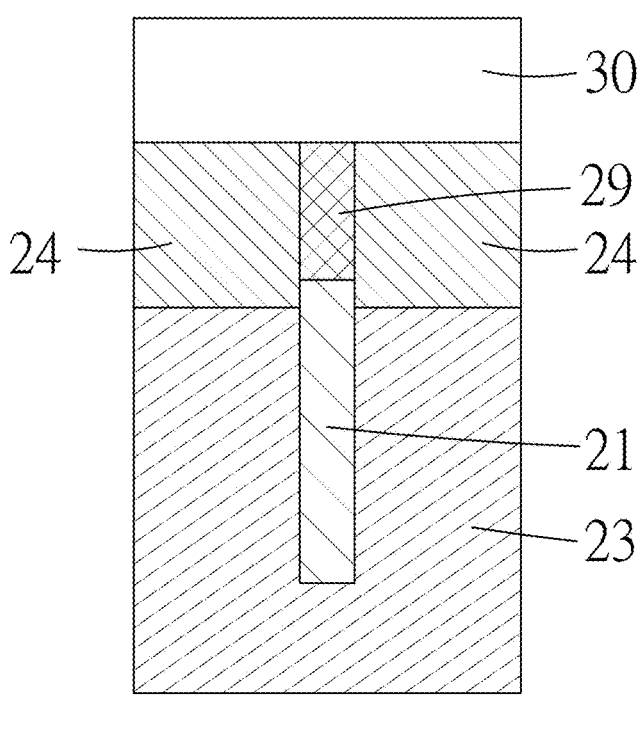
Figure 19A:
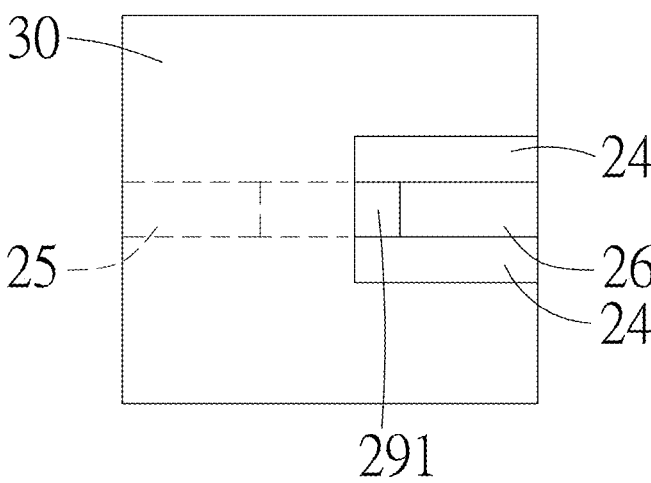
Figure 19B:
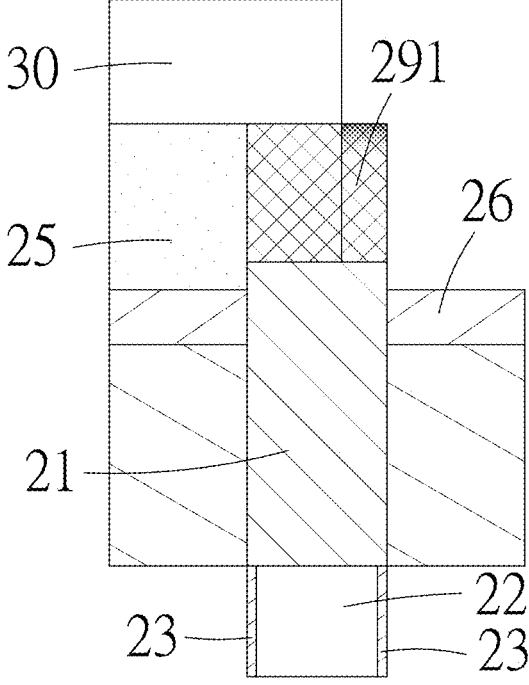
Figure 19C:
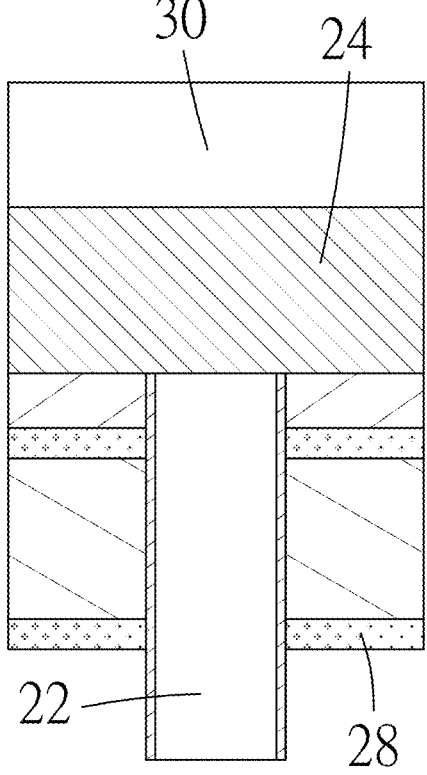
Figure 19D:
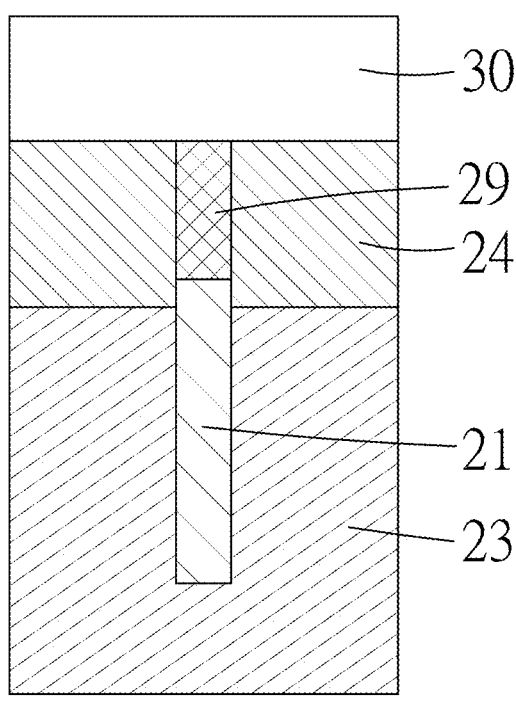
Figure 19E:
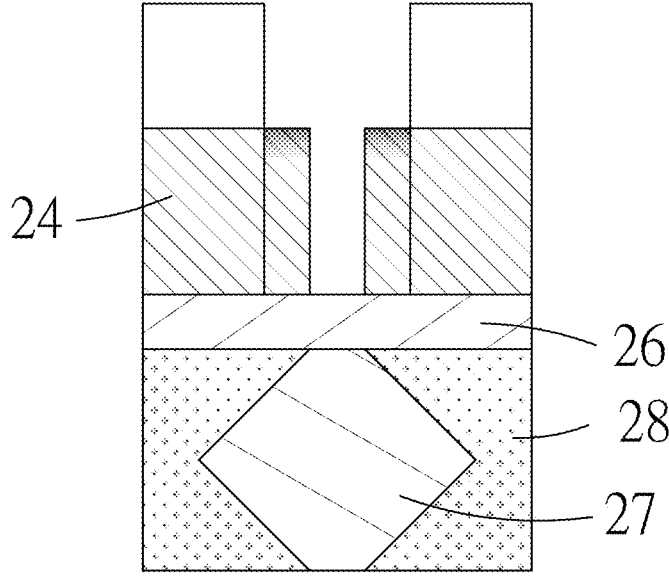
Figure 20A:
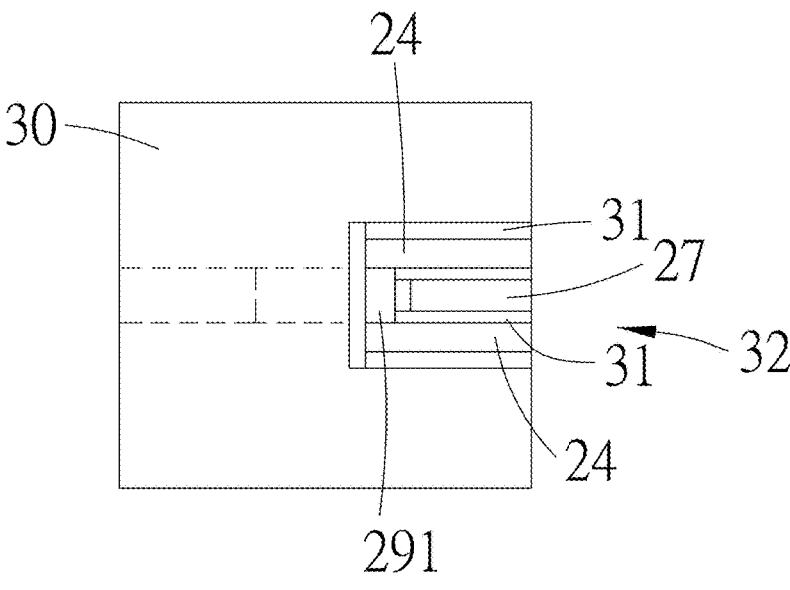
Figure 20B:
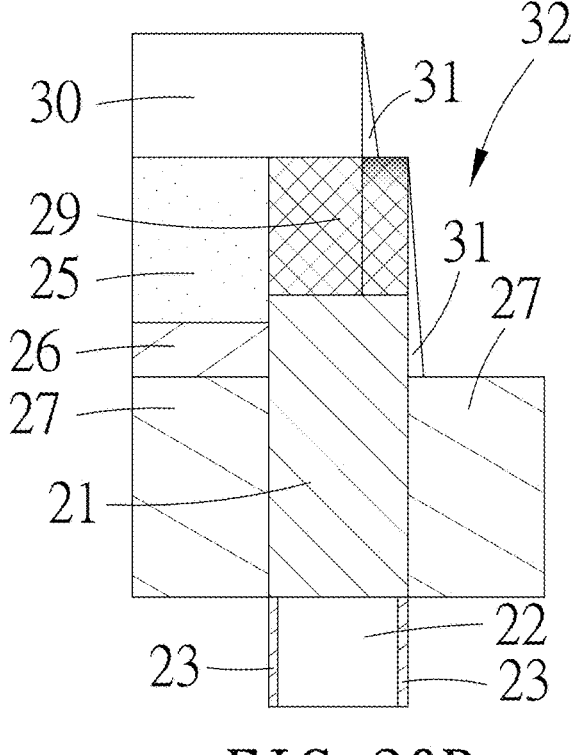
Figure 20C:
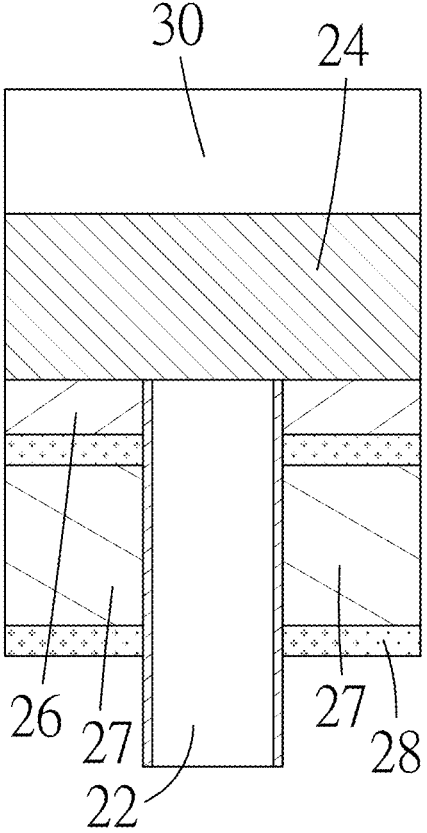
Figure 20D:
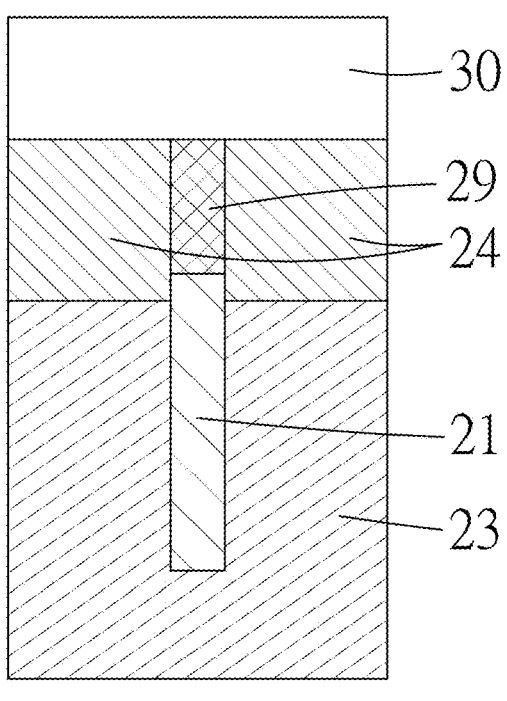
Figure 20E:
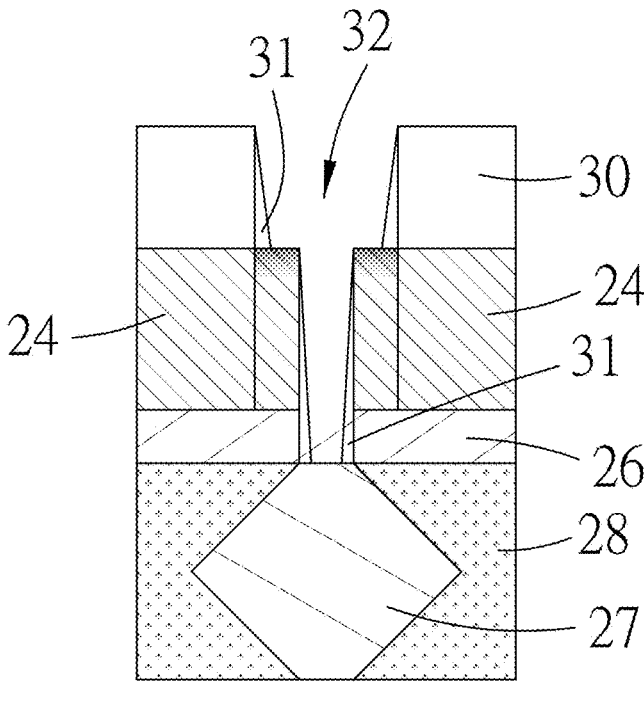
Figure 21A:
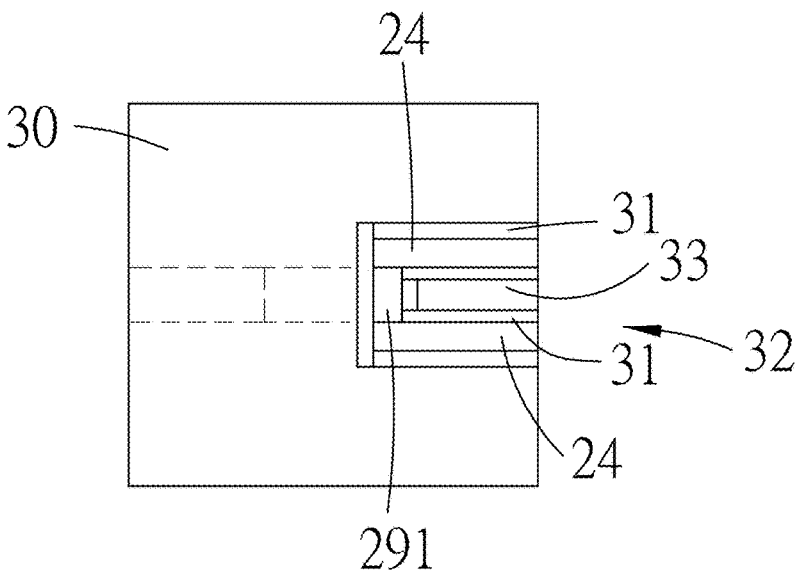
Figure 21B:
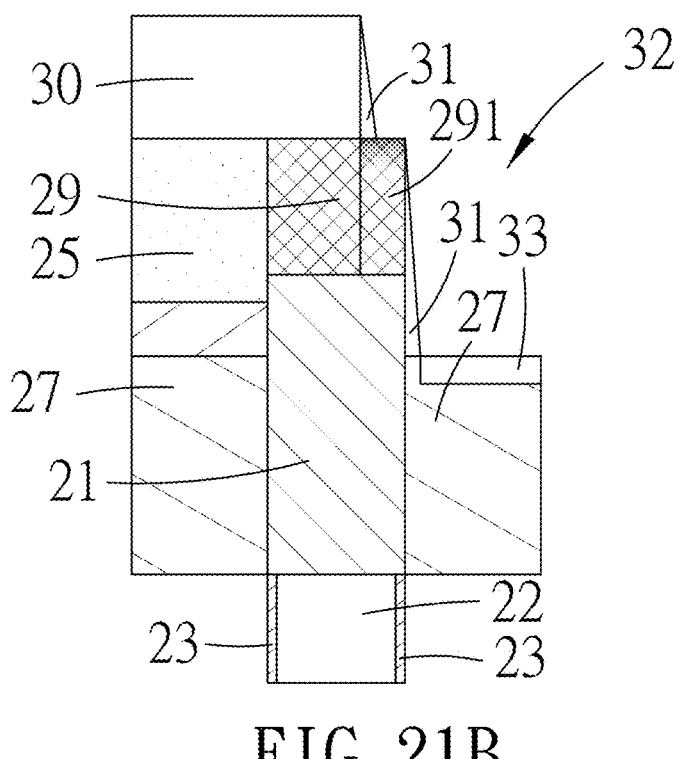
Figure 21C:
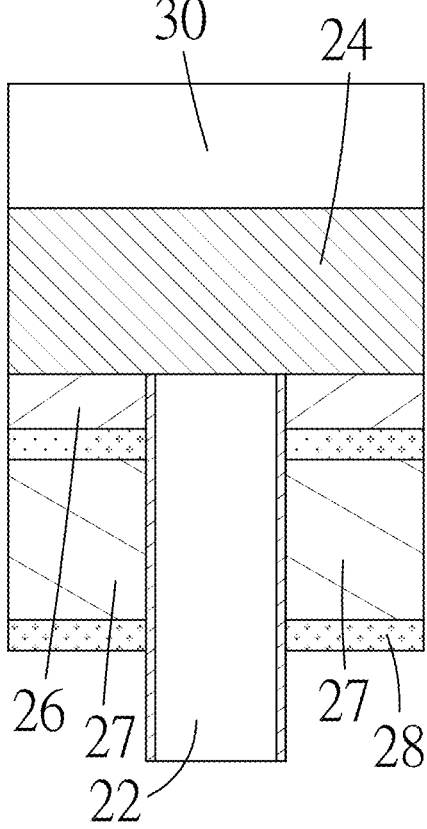
Figure 21D:
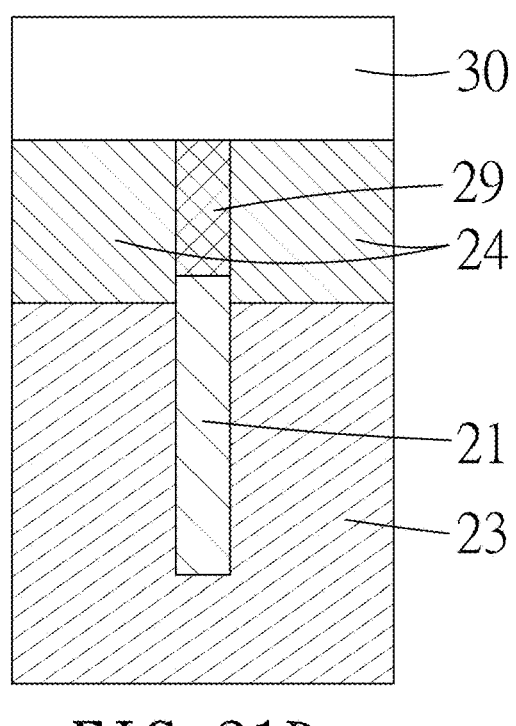
Figure 21E:
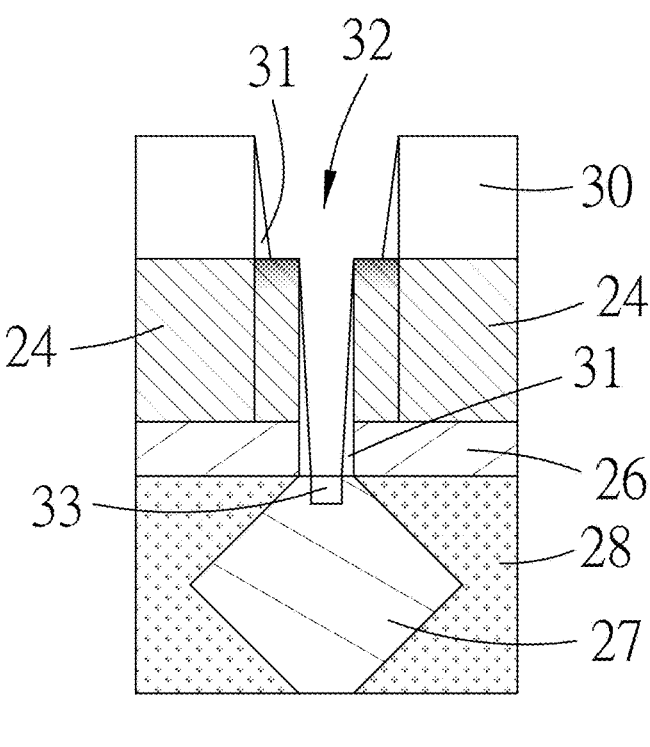
Figure 22A:
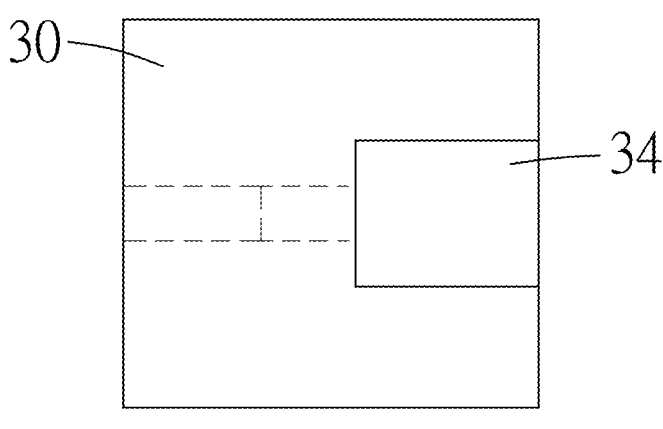
Figure 22B:
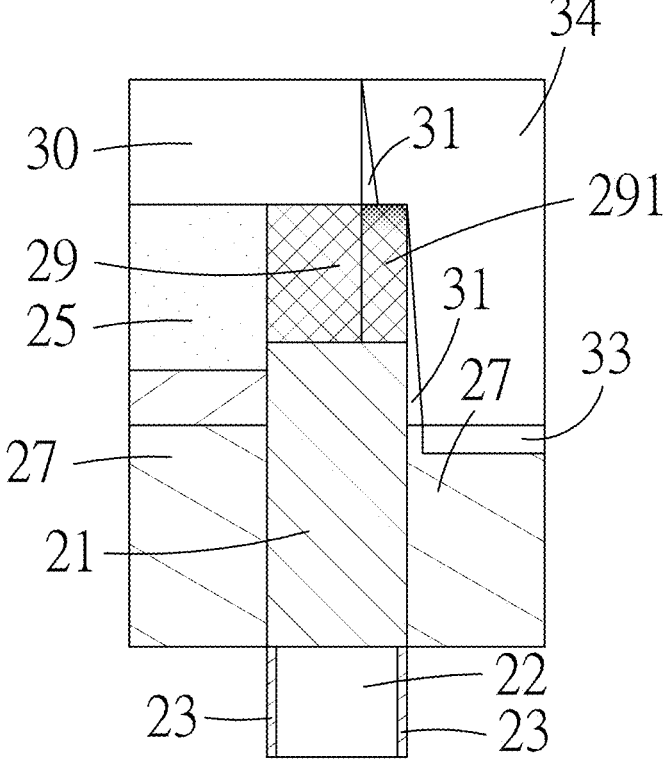
Figure 22C:
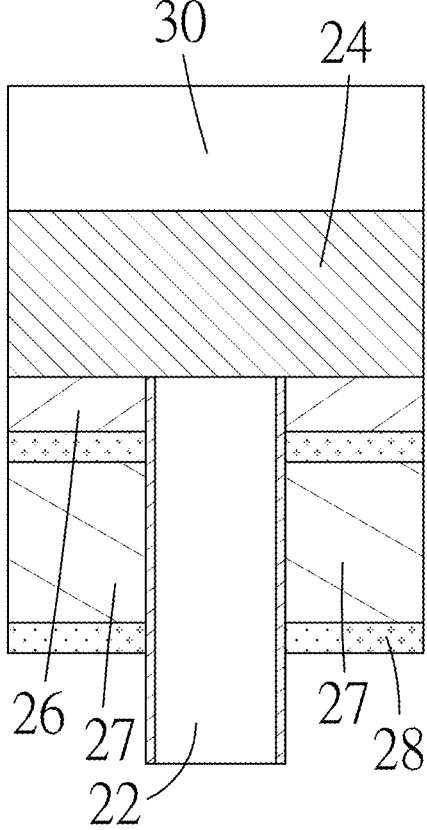
Figure 22D:
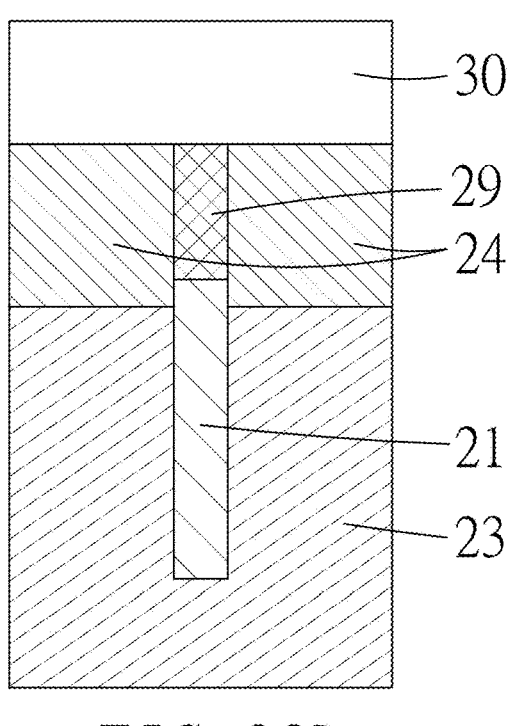
Figure 22E:
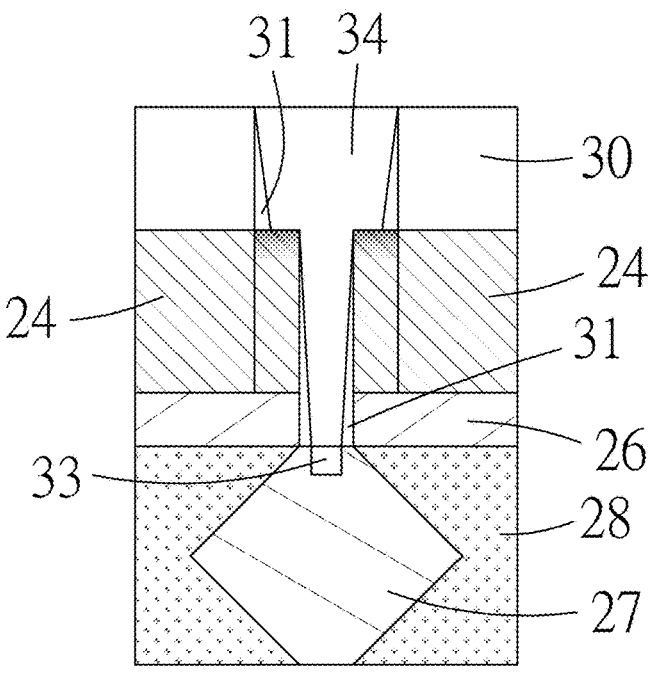
Figure 23A:
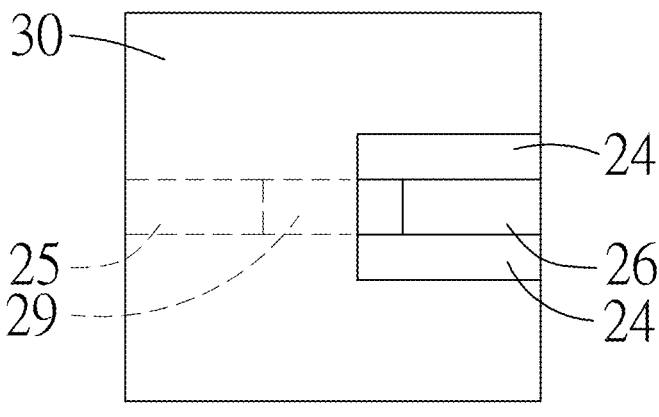
FIGS. 23A-23E to 27A-27E are schematics view illustrating some intermediate stages of a manufacturing method in accordance with some alternative embodiments.
Figure 23B:
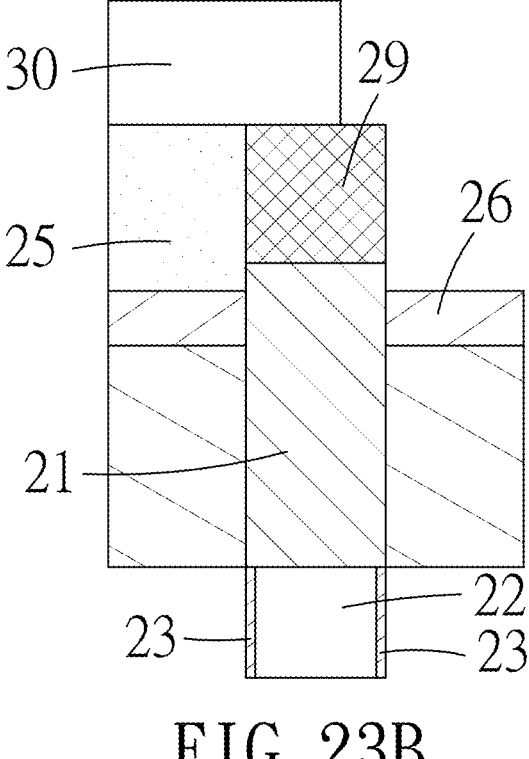
Figure 23C:
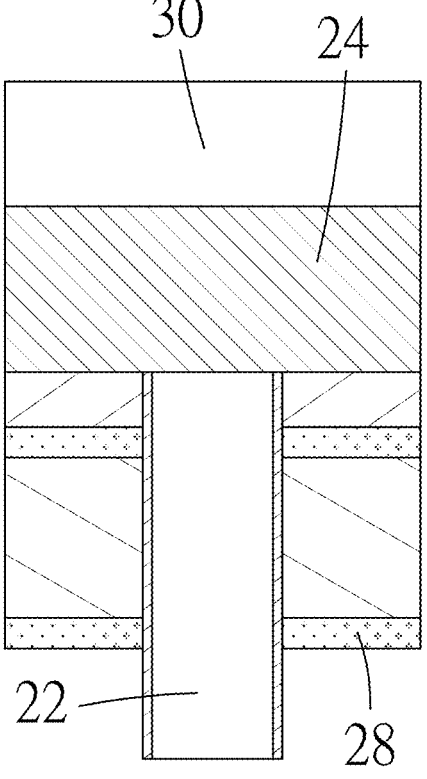
Figure 23D:
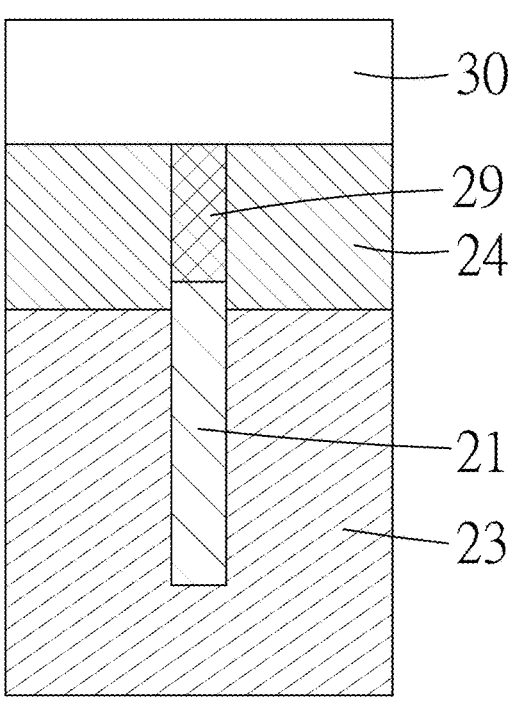
Figure 23E:
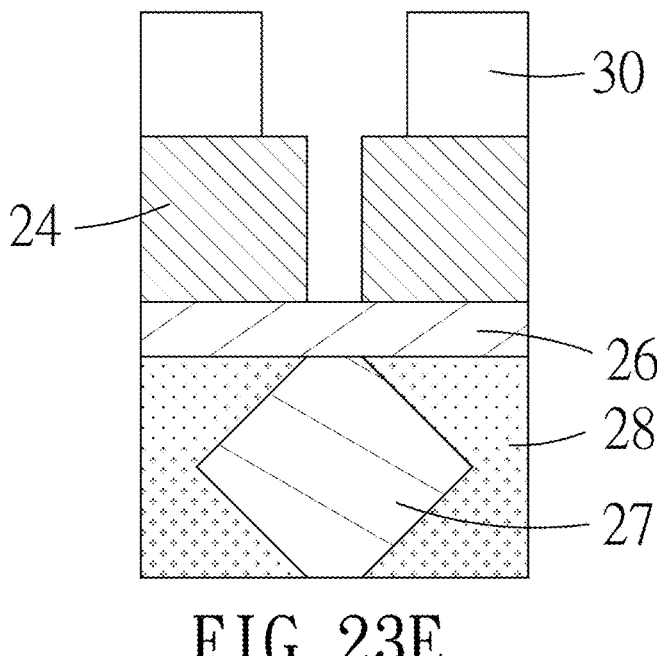
Figure 24A:
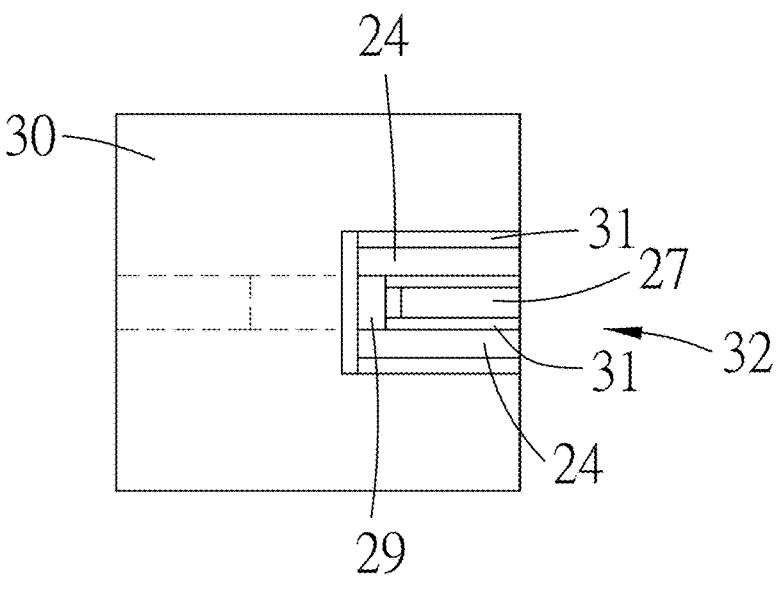
Figure 24B:
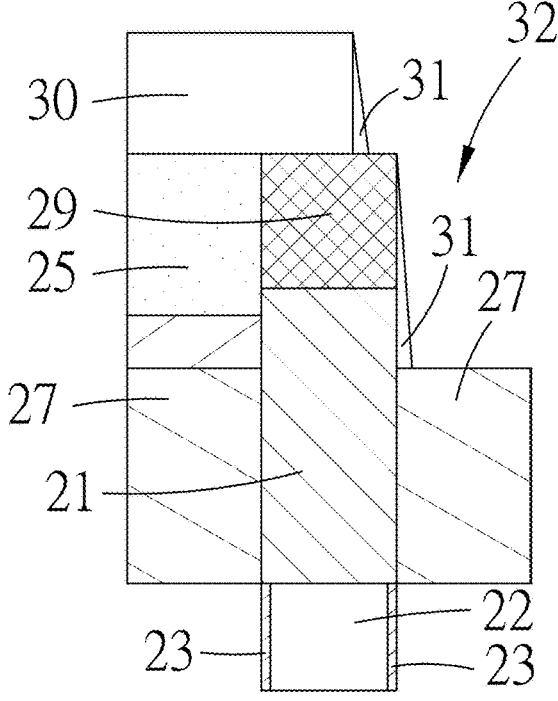
Figure 24C:
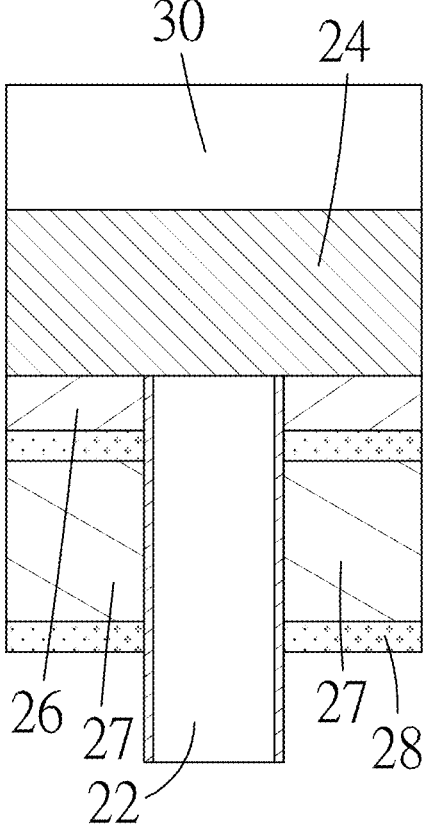
Figure 24D:
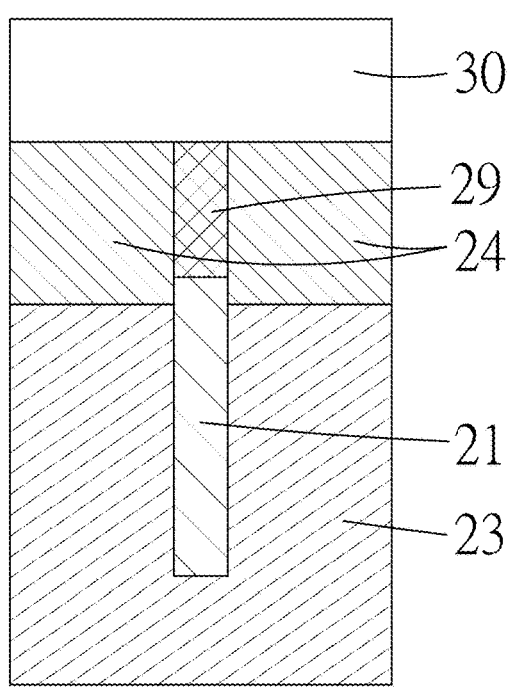
Figure 24E:
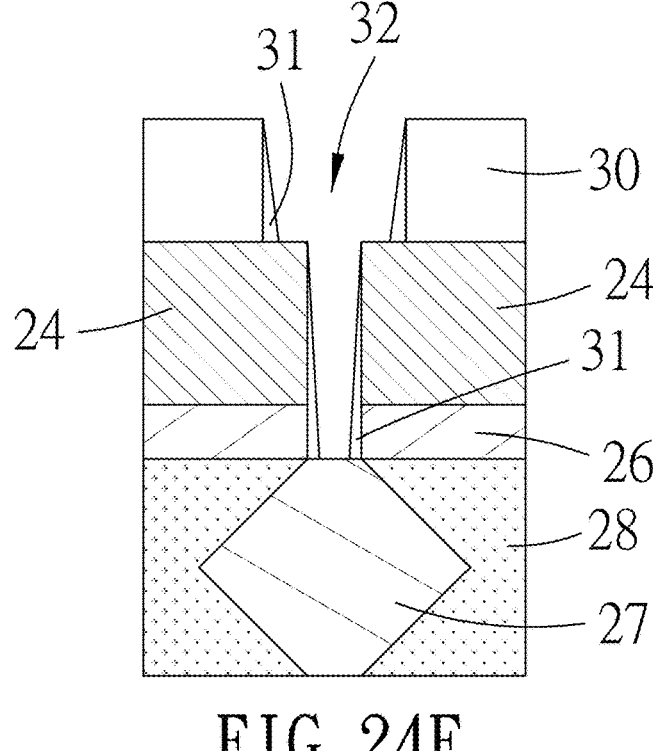
Figure 25A:
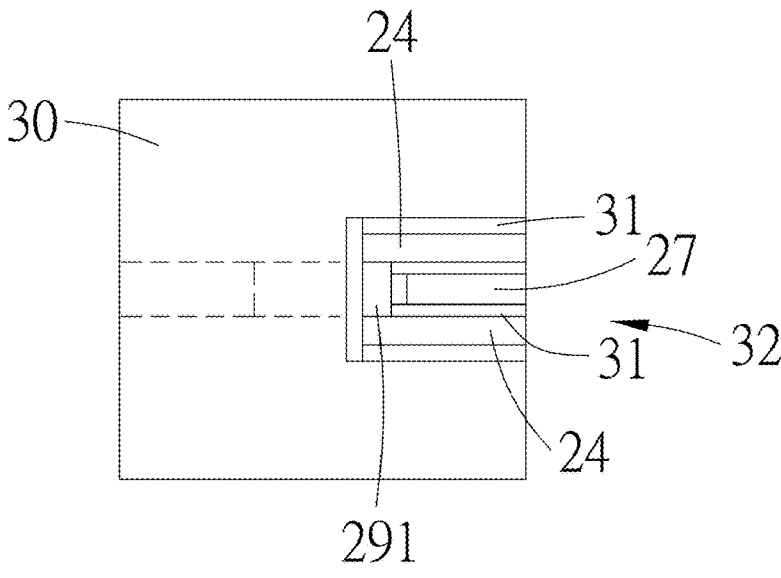
Figure 25B:
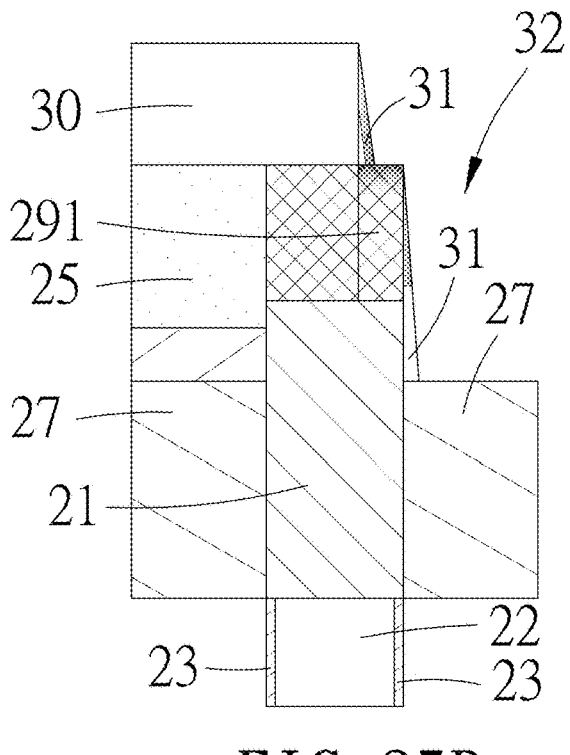
Figure 25C:
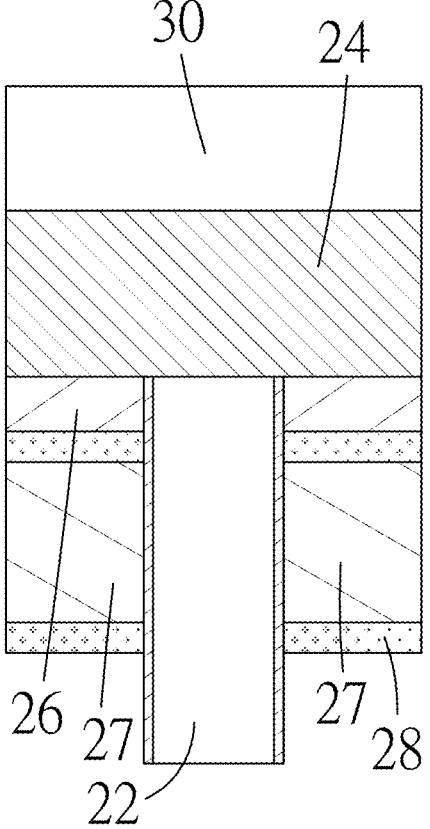
Figure 25D:
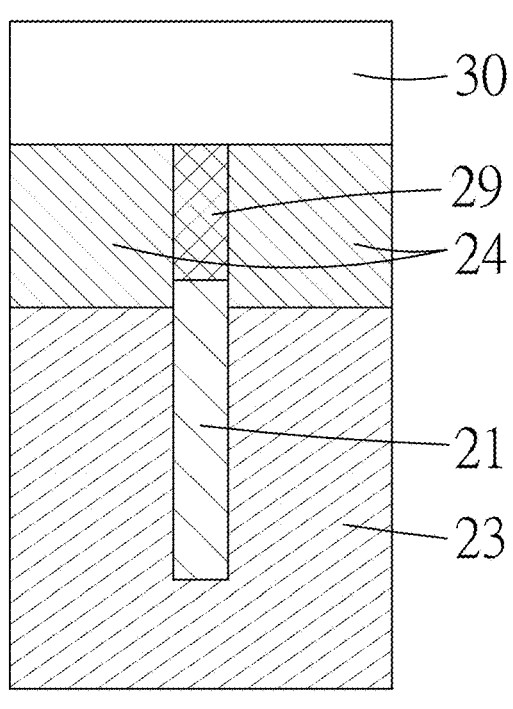
Figure 25E:
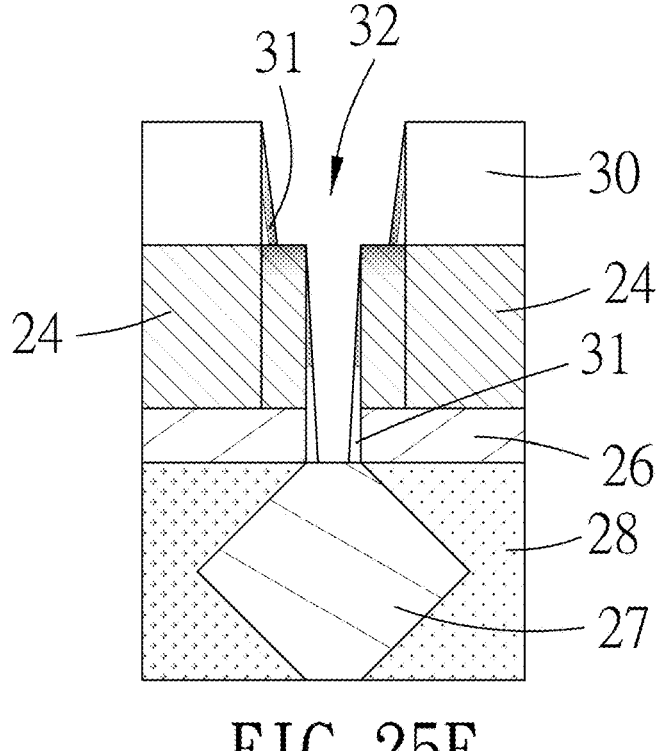
Figure 26A:
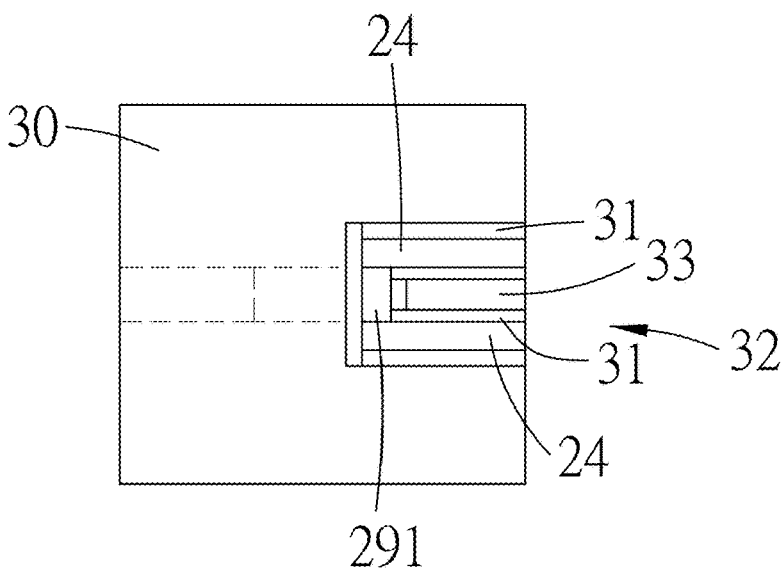
Figure 26B:
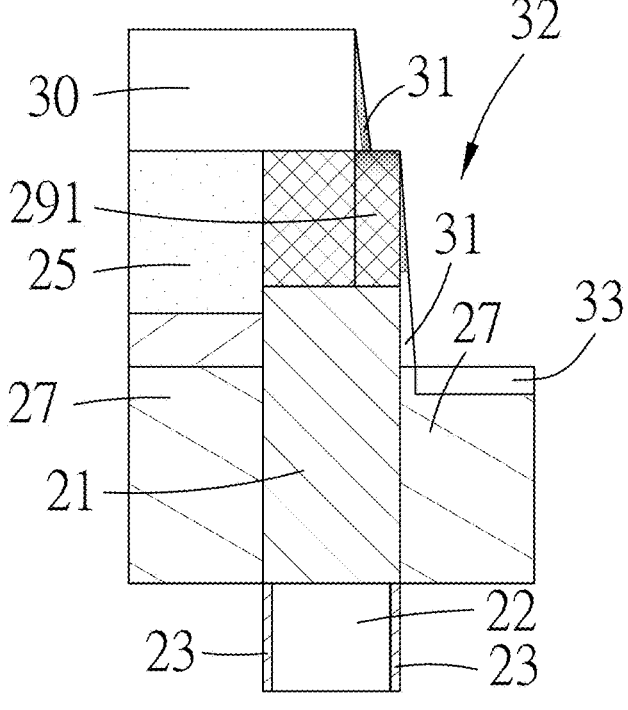
Figure 26C:
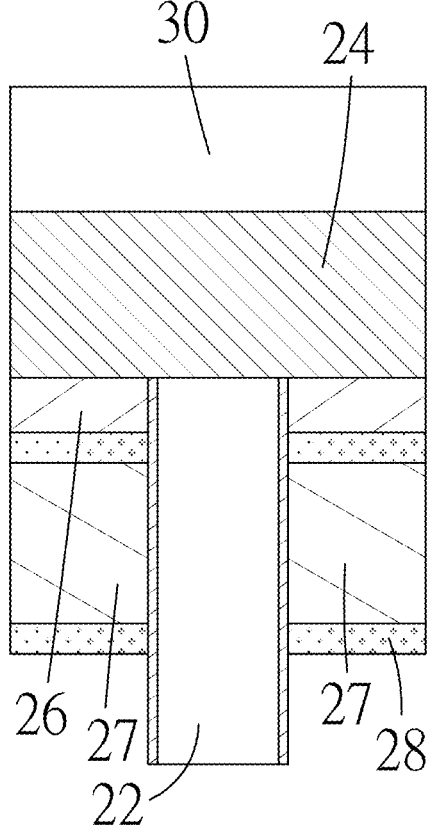
Figures 26D, 26E:
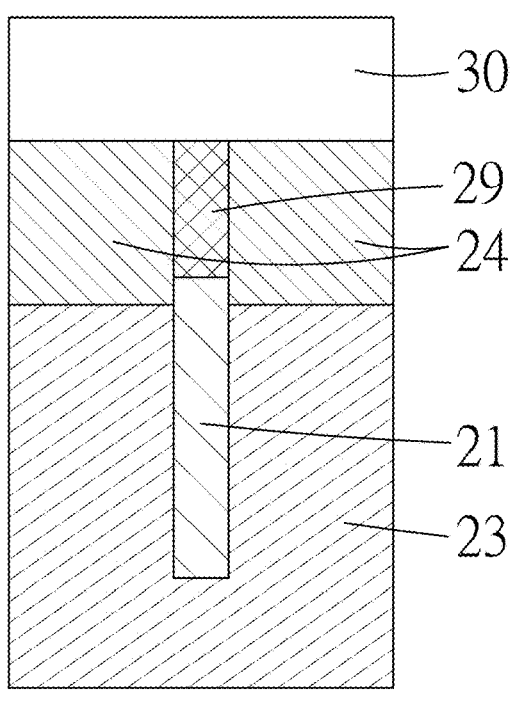
Figure 27A:
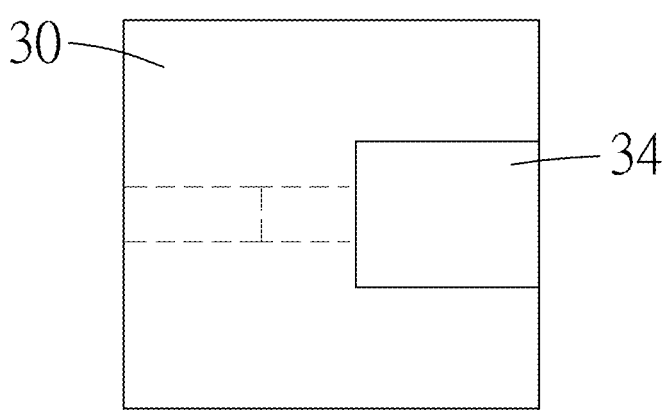
Figure 27B:
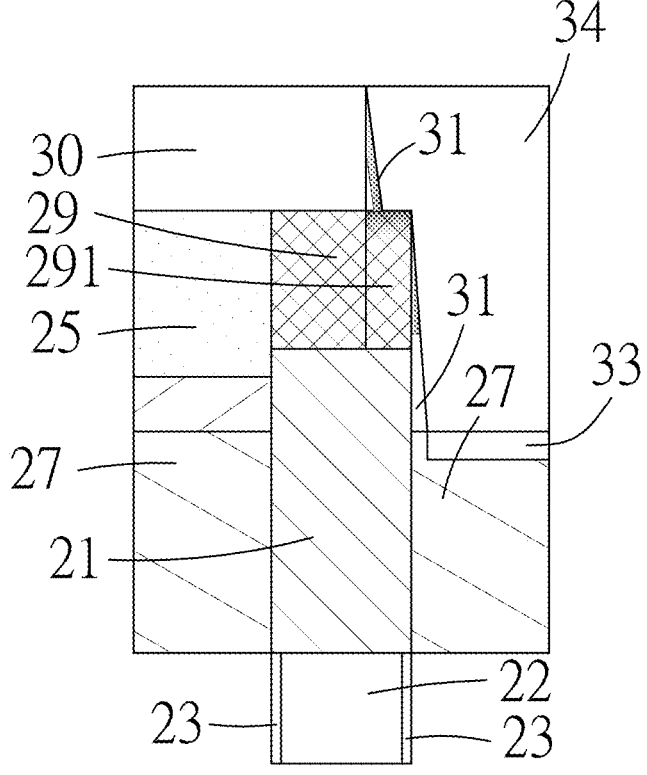
Figure 27C:
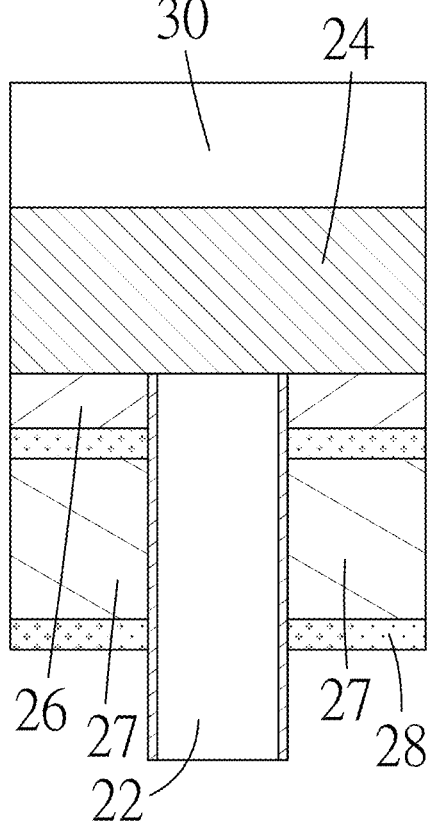
Figure 27D:
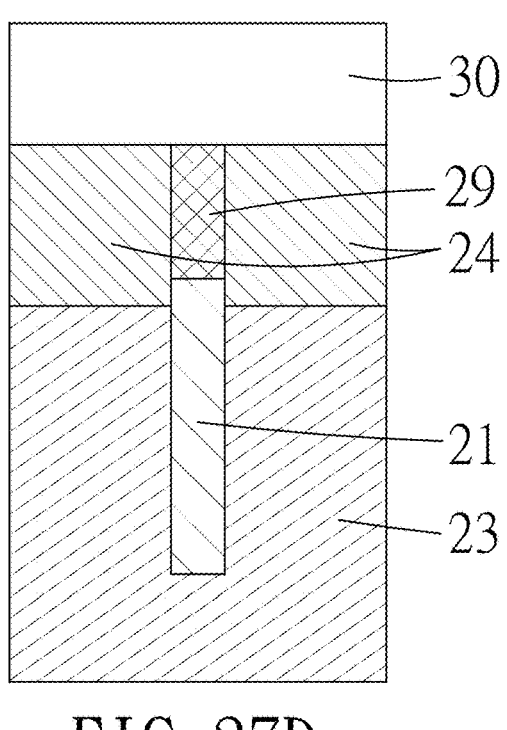
Figure 27E:
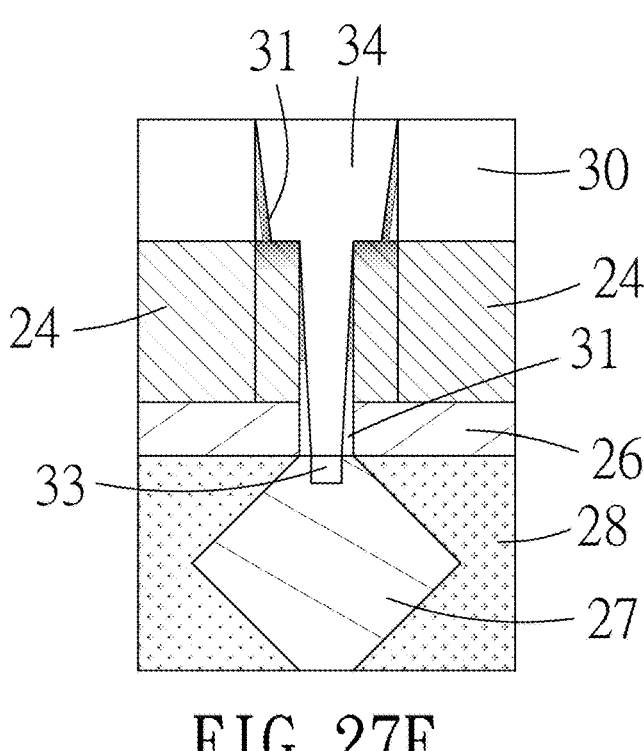

Referring to the example illustrated in FIGS. 18A to 18E, following step 120 and the example illustrated in FIGS. 17A to 178E, step 118 of the method 100 is performed where an implantation process is performed on the exposed isolation parts, the exposed SAC part and the one of the dummy epitaxial portions that is exposed from the patterned opening of the hard mask, as well as the hard mask. It is noted that since the exposed SAC part is exposed from the patterned opening of the hard mask 30 and the remaining portion of the SAC layer 29 is covered by the hard mask 30, the exposed SAC part that has undergone the implantation process forms an implanted SAC part 291. FIGS. 18A to 18E are views similar to FIGS. 17A to 17E, respectively, but illustrating the structure after step 118 is performed following step 120. In some embodiments, the implantation process is similar to that described above with reference to FIGS. 10A to 10E, and thus the details thereof are omitted for the sake of brevity.

Referring to the example illustrated in FIGS. 19A to 19E, following step 118 and the example illustrated in FIGS. 18A to 18E, step 122 of the method 100 is performed where the one of the dummy epitaxial portions that is exposed from the patterned opening of the hard mask is removed. FIGS. 19A to 19E are views similar to FIGS. 17A to 17E, respectively, but illustrating the structure after step 122. In some embodiments, removal of the one of the dummy epitaxial portions in this example is similar to removal of the one of the dummy epitaxial portions described above with reference to FIGS. 12A to 12E, and thus the details thereof are omitted for the sake of brevity.

Referring to the example illustrated in FIGS. 20A to 20E, following step 122 and the example illustrated in FIGS. 19A to 19E, step 124 of the method 100 is then performed to form dielectric spacers on sidewalls of the hard mask and the exposed isolation parts that have undergone implantation. FIGS. 20A to 20E are views similar to FIGS. 17A to 17E, respectively, but illustrating the structure after step 124. Similarly, before formation of dielectric spacers 31, the portion of the coverage dielectric layer 26 that is exposed from the patterned opening of the hard mask 30 is first removed, so that a contact recess 32 is formed and extends from the hard mask 30, through the isolation portions 24 and through the coverage dielectric layer 26 to expose one of the epitaxial regions 27 previously covered by the coverage dielectric layer 26 and beneath the one of the dummy epitaxial portions 25 thus removed. In some embodiments, formation of the dielectric spacers 31 in this example is similar to formation of the dielectric spacers 31 described above with reference to FIGS. 13A to 13E, and thus the details thereof are omitted for the sake of brevity.

Referring to the example illustrated in FIGS. 21A to 21E, following step 124 and the example illustrated in FIGS. 20A to 20E, step 126 of the method 100 is then performed where a silicide layer is formed on the one of the epitaxial regions that is exposed from the contact recess. FIGS. 21A to 21E are views similar to FIGS. 17A to 17E, respectively, but illustrating the structure after step 126. In some embodiments, formation of the silicide layer in this example is similar to formation of the silicide layer described above with reference to FIGS. 14A to 14E, and thus the details thereof are omitted for the sake of brevity. Similarly, prior to step 126 of forming a silicide layer, the pre-silicide cleaning process is performed to remove any undesired materials remaining on the structure shown in FIGS. 20A to 20E, such as oxides remaining in the contact recess 32.

Referring to the example illustrated in FIGS. 22A to 22E, following step 126 and the example illustrated in FIGS. 21A to 21E, step 128 of the method 100 is then performed where a contact plug is formed on the silicide layer. FIGS. 22A to 22E are views similar to FIGS. 17A to 17E, respectively, but illustrating the structure after step 128. In some embodiments, formation of the contact plug in this example is similar to formation of the contact plug described above with reference to FIGS. 16A to 16E, and thus the details thereof are omitted for the sake of brevity.

It is noted that even though only a portion of the SAC layer (e.g., the implanted SAC part 291) is implanted with the implantation element, with the implanted portion being the exposed SAC part, the exposed SAC part may be prevented from being etched by the pre-silicide cleaning process. In this way, the semiconductor fin can still be covered by the SAC layer and the dielectric spacers so as to avoid electrical contact with the contact plug.

In some embodiments, some steps in the method 100 may be modified, replaced, or eliminated without departure from the spirit and scope of the present disclosure. For example, rather than being performed after formation of the SAC layer in the fin recess (i.e., step 116), the implantation process is instead performed after formation of the dielectric spacers and before formation of a silicide layer, so that the etch resistance of the SAC layer can still be enhanced to prevent or reduce loss of the SAC layer by the pre-silicide cleaning process. In other words, the order of steps 118 to 124 of the method 100 illustrated in FIG. 1 may be changed in such a manner that step 120 directly follows step 116, and step 118 is to be performed subsequent to step 124 and prior to step 126.

Referring to the example illustrated in FIGS. 23A to 23E that follows the example illustrated in FIGS. 17A to 17E where a hard mask is formed, step 122 of the method 100 is performed where the one of the dummy epitaxial portions that is exposed from the patterned opening of the hard mask is removed. FIGS. 23A to 23E are views similar to FIGS. 17A to 17E, respectively, but illustrating the structure after step 122. In some embodiments, removal of the one of the dummy epitaxial portions in this example is similar to removal of the one of the dummy epitaxial portions described above with reference to FIGS. 12A to 12E, and thus the details thereof are omitted for the sake of brevity.

Referring to the example illustrated in FIGS. 24A to 24E, following step 122 and the example illustrated in FIGS. 23A to 23E, step 124 of the method 100 is then performed where dielectric spacers are formed on sidewalls of the hard mask and the isolation portions. FIGS. 24A to 24E are views similar to FIGS. 23A to 23E, respectively, but illustrating the structure after step 124. Similarly, before formation of dielectric spacers 31, the portion of the coverage dielectric layer 26 that is exposed from the patterned opening of the hard mask 30 is first removed, so that a contact recess 32 is formed to expose one of the epitaxial regions 27 that was previously covered by the coverage dielectric 26 and beneath the one of the dummy epitaxial portions 25 thus removed. In some embodiments, formation of the dielectric spacers 31 in this example is similar to formation of the dielectric spacers 31 described above with reference to FIGS. 13A to 13E, and thus the details thereof are omitted for the sake of brevity.

Referring to the example illustrated in FIGS. 25A to 25E, following step 124 and the example illustrated in FIGS. 24A to 24E, step 118 of the method 100 is then performed where an implantation process is performed on the dielectric spacers, and the exposed SAC part and the exposed isolation parts that are exposed from the patterned opening of the hard mask. FIGS. 25A to 25E are views similar to FIGS. 23A to 23E, respectively, but illustrating the structure after step 118. It is noted that since the exposed SAC part is exposed from the patterned opening of the hard mask 30 and the remaining portion of the SAC layer 29 is covered by the hard mask 30, the exposed SAC part that has undergone the implantation process forms an implanted SAC part 291. In some embodiments, an implantation angle of the implantation process is controlled such that only the dielectric spacers, the exposed SAC part and the exposed isolation parts are implanted with the implantation element, and the one of the epitaxial regions 27 that is exposed from the contact recess 32 is not implanted with the implantation element. In some embodiments, the implantation process in this example is similar to that described above with reference to FIGS. 10A to 10E, and thus the details thereof are omitted for the sake of brevity.

Referring to the example illustrated in FIGS. 26A to 26E, following step 118 and the example illustrated in FIGS. 25A to 25E, step 126 of the method 100 is then performed where a silicide layer is formed on the one of the epitaxial regions that is exposed from the contact recess. FIGS. 26A to 26E are views similar to FIGS. 23A to 23E, respectively, but illustrating the structure after step 126. In some embodiments, formation of the silicide layer in this example is similar to formation of the silicide layer described above with reference to FIGS. 14A to 14E, and thus the details thereof are omitted for the sake of brevity. Similarly, prior to step 126 of forming a silicide layer, the pre-silicide cleaning process is performed to remove any undesired materials remaining on the structure shown in FIGS. 25A to 25E, such as oxides remaining in the contact recess 32.

Referring to the example illustrated in FIGS. 27A to 27E, following step 126 and the example illustrated in FIGS. 26A to 26E, step 128 of the method 100 is then performed where a contact plug is formed on the silicide layer. FIGS. 27A to 27E are views similar to FIGS. 23A to 23E, respectively, but illustrating the structure after step 128. In some embodiments, formation of the contact plug in this example is similar to formation of the contact plug described above with reference to FIGS. 16A to 16E, and thus the details thereof are omitted for the sake of brevity.

In this disclosure for manufacturing a semiconductor device where a silicide layer and a contact plug are formed from a back side of the semiconductor device, by virtue of the implantation process, the dielectric property of a SAC layer is modified so as to enhance the etch resistance of the SAC layer against the pre-silicide cleaning process. In this way, the SAC layer formed on a semiconductor fin can be prevented from being etched by the pre-silicide cleaning process, so that the semiconductor fin can still be covered by the SAC layer and the dielectric spacers so as to avoid electrical contact with the contact plug. Moreover, the timing of the implantation process can be changed according to different needs and design considerations, as long as the implantation process is performed prior to the pre-silicide cleaning process. For example, the implantation process may be performed subsequent to formation of the SAC layer and prior to formation of a hard mask; alternatively, the implantation process may be performed subsequent to formation of a hard mask and prior to removal of a dummy epitaxial portion; as another alternative, the implantation process may be performed subsequent to formation of dielectric spacers and prior to formation of a silicide layer. Therefore, the method in this disclosure provides a flexible strategy for manufacturing a semiconductor device.

In accordance with some embodiments of the present disclosure, a semiconductor device includes a semiconductor fin, an epitaxial region located on a side of the semiconductor fin, a silicide layer disposed on the epitaxial region, a contact plug disposed on the silicide layer and over the epitaxial region, and a self-aligned contact (SAC) layer disposed on the semiconductor fin. At least a part of the SAC layer is implanted with at least one implantation element. The semiconductor fin is spaced apart from the contact plug by the SAC layer.

In accordance with some embodiments of the present disclosure, an upper part of the SAC layer opposite to the semiconductor fin is implanted with the at least one implantation element.

In accordance with some embodiments of the present disclosure, the semiconductor device further includes a dummy epitaxial portion that is located on one side of the SAC layer opposite to the contact plug. The dummy epitaxial portion is implanted with the at least one implantation element.

In accordance with some embodiments of the present disclosure, the semiconductor device further includes a dielectric spacer located on the one side of the semiconductor fin and disposed on the epitaxial region. The semiconductor fin is spaced apart from the contact plug further by the dielectric spacer.

In accordance with some embodiments of the present disclosure, the semiconductor device further includes a hard mask that has a patterned opening and that partially covers the SAC layer. The SAC layer includes an exposed SAC part that is exposed from the patterned opening of the hard mask, wherein an upper part of the exposed SAC part opposite to the semiconductor fin is implanted with the at least one implantation element.

In accordance with some embodiments of the present disclosure, the dielectric spacer is further located on a side of the exposed SAC part, and the exposed SAC part is spaced apart from the contact plug by the dielectric spacer.

In accordance with some embodiments of the present disclosure, the dielectric spacer is implanted with the at least one implantation element.

In accordance with some embodiments of the present disclosure, the semiconductor device further includes another dielectric spacer that is located on a side of the hard mask. The hard mask is spaced apart from the contact plug by the another dielectric spacer.

In accordance with some embodiments of the present disclosure, the another dielectric spacer is implanted with the at least one implantation element.

In accordance with some embodiments of the present disclosure, the at least one implantation element includes carbon, silicon, or a combination thereof.

In accordance with some embodiments of the present disclosure, a semiconductor device includes an epitaxial region disposed in an interconnect dielectric (ILD) layer, a silicide layer disposed on the epitaxial region, a contact plug formed on the silicide layer and above the epitaxial region, two isolation portions disposed over the ILD layer and located on two opposite sides of the contact plug, and a hard mask disposed on the isolation portions and partially covering the isolation portions. For each of the two isolation portions, at least a part of the isolation portion is implanted with at least one implantation element.

In accordance with some embodiments of the present disclosure, for each of the two isolation portions, an upper part of the isolation portion opposite to the ILD layer is implanted with the at least one implantation element.

In accordance with some embodiments of the present disclosure, each of the two isolation portions includes an exposed isolation part that is exposed from a patterned opening of the hard mask, and for each of the exposed isolation parts of the two isolation portions, an upper part of the exposed isolation part opposite to the ILD layer is implanted with the at least one implantation element.

In accordance with some embodiments of the present disclosure, the semiconductor device further includes dielectric spacers located on the two opposite sides of the contact plug. Each of the dielectric spacers is disposed between the contact plug and a corresponding one of the two isolation portions, and is implanted with the at least one implantation element.

In accordance with some embodiments of the present disclosure, a method for manufacturing a semiconductor device includes:

forming a self-aligned contact (SAC) layer on a semiconductor fin, the semiconductor fin being disposed beside an epitaxial region;

performing an implantation process on the SAC layer to implant at least one implantation element into the SAC layer;

forming a silicide layer on the epitaxial region; and forming a contact plug on the silicide layer beside the SAC layer, the semiconductor fin being spaced apart from the contact plug by the SAC layer.

In accordance with some embodiments of the present disclosure, subsequent to performing an implantation process, the method further includes:

forming a hard mask on the SAC layer, the hard mask having a patterned opening that corresponds in position to a dummy epitaxial portion which is disposed over the epitaxial region; and

removing the dummy epitaxial portion to form a contact recess so that the epitaxial region is exposed through the contact recess.

In accordance with some embodiments of the present disclosure, subsequent to removing the dummy epitaxial portion and prior to forming a silicide layer, the method further includes:

forming dielectric spacers on sidewalls of the hard mask, the SAC layer and the semiconductor fin that border the contact recess; and performing a pre-silicide cleaning process on the SAC layer that is implanted with the at least one implantation element, and on the dielectric spacers.

In accordance with some embodiments of the present disclosure, prior to performing an implantation process, the method further includes:

forming a hard mask on the SAC layer, the hard mask having a patterned opening that corresponds in position to a dummy epitaxial portion which is disposed over the epitaxial region.

In accordance with some embodiments of the present disclosure, subsequent to performing an implantation process and prior to forming a silicide layer, the method further includes:

removing the dummy epitaxial portion to form a contact recess so that the epitaxial region is exposed through the contact recess;

forming dielectric spacers on sidewalls of the hard mask, the SAC layer and the semiconductor fin that border the contact recess; and performing a pre-silicide cleaning process on the SAC layer that is implanted with the at least one implantation element, and on the dielectric spacers.

In accordance with some embodiments of the present disclosure, subsequent to forming a SAC layer and prior to performing an implantation process, the method further includes:

forming a hard mask on the SAC layer, the hard mask having a patterned opening that corresponds in position to a dummy epitaxial portion which is disposed over the epitaxial region;

removing the dummy epitaxial portion to form a contact recess so that the epitaxial region is exposed through the contact recess; and forming dielectric spacers on sidewalls of the hard mask, the SAC layer and the semiconductor fin that border the contact recess;

subsequent to performing an implantation process, the method further comprising performing a pre-silicide cleaning process on the SAC layer that is implanted with the at least one implantation element, and on the dielectric spacers.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

16

What is claimed is:

1. A semiconductor device, comprising:
a semiconductor fin;
an epitaxial region located on a side of the semiconductor fin;
a silicide layer disposed on the epitaxial region;
a contact plug disposed on the silicide layer and over the epitaxial region; and
a self-aligned contact (SAC) layer disposed on the semiconductor fin, at least a part of the SAC layer being implanted with at least one implantation element, the semiconductor fin being spaced apart from the contact plug by the SAC layer.

2. The semiconductor device of claim 1, wherein an upper part of the SAC layer opposite to the semiconductor fin is implanted with the at least one implantation element.

3. The semiconductor device of claim 1, further comprising a dummy epitaxial portion that is located on one side of the SAC layer opposite to the contact plug, the dummy epitaxial portion being implanted with the at least one implantation element.

4. The semiconductor device of claim 1, further comprising a dielectric spacer located on the one side of the semiconductor fin and disposed on the epitaxial region, the semiconductor fin being spaced apart from the contact plug further by the dielectric spacer.

5. The semiconductor device of claim 4, further comprising a hard mask that has a patterned opening and that partially covers the SAC layer, the SAC layer including an exposed SAC part that is exposed from the patterned opening of the hard mask, wherein an upper part of the exposed SAC part opposite to the semiconductor fin is implanted with the at least one implantation element.

6. The semiconductor device of claim 5, wherein the dielectric spacer is further located on a side of the exposed SAC part, and the exposed SAC part is spaced apart from the contact plug by the dielectric spacer.

7. The semiconductor device of claim 6, wherein the dielectric spacer is implanted with the at least one implantation element.

8. The semiconductor device of claim 5, further comprising another dielectric spacer that is located on a side of the hard mask, the hard mask being spaced apart from the contact plug by the another dielectric spacer.

9. The semiconductor device of claim 8, wherein the another dielectric spacer is implanted with the at least one implantation element.

10. The semiconductor device of claim 1, wherein the at least one implantation element includes carbon, silicon, or a combination thereof.

11. A method for manufacturing a semiconductor device, comprising:
forming a self-aligned contact (SAC) layer on a semiconductor fin, the semiconductor fin being disposed beside an epitaxial region;
performing an implantation process on the SAC layer to implant at least one implantation element into the SAC layer;
forming a silicide layer on the epitaxial region; and
forming a contact plug on the silicide layer beside the SAC layer, the semiconductor fin being spaced apart from the contact plug by the SAC layer.

12. The method of claim 11, further comprising:
forming a hard mask on the SAC layer, the hard mask having a patterned opening that corresponds in position to a dummy epitaxial portion which is disposed over the epitaxial region;

removing the dummy epitaxial portion to form a contact recess so that the epitaxial region is exposed through the contact recess;

forming dielectric spacers on sidewalls of the hard mask, the SAC layer and the semiconductor fin that border the contact recess; and performing a pre-silicide cleaning process on the SAC layer that is implanted with the at least one implantation element, and on the dielectric spacers.

13. The method of claim 12, wherein, after performing the implantation process, forming the hard mask, removing the dummy epitaxial portion, forming the dielectric spacers, performing the pre-silicide cleaning process and forming the silicide layer are sequentially performed.

14. The method of claim 12, wherein the implantation process is performed after forming the hard mask.

15. The method of claim 14, wherein, after performing the implantation process, removing the dummy epitaxial portion, forming the dielectric spacers and performing the pre-silicide cleaning process are sequentially performed prior to forming the silicide layer.

16. The method of claim 14, wherein after forming the hard mask, removing the dummy epitaxial portion, forming the dielectric spacers, performing the implantation process and performing the pre-silicide cleaning process are sequentially performed prior to forming the silicide layer.

17. A method for manufacturing a semiconductor device, comprising:

forming an epitaxial region on a lateral side of a semiconductor fin in a first direction;

forming a self-aligned contact (SAC) layer on the semiconductor fin in a second direction different from the first direction, the SAC layer having an upper part and a lower part which are respectively distal from and proximate to the semiconductor fin;

performing an implantation process on the SAC layer to implant at least one implantation element into the upper part of the SAC layer;

after performing the implantation process, forming a silicide layer on the epitaxial region in the second direction; and forming a contact plug on the silicide layer opposite to the epitaxial region, the semiconductor fin being spaced apart from the contact plug by the SAC layer.

18. The method of claim 17, further comprising forming two isolation portions sandwiching the semiconductor fin in a third direction different from the first direction and the second direction prior to forming the epitaxial region, such that the two isolation portions are located on the epitaxial region in the second direction and are located on two opposite sides of the contact plug, wherein in performing the implantation process, at least a part of each of the isolation portions is implanted with the at least one implantation element.

19. The method of claim 17, further comprising forming a hard mask on the SAC layer opposite to the epitaxial region, the hard mask having a patterned opening that exposes a portion of the upper part of the SAC layer.

20. The method of claim 19, further comprising forming a dielectric spacer on sidewalls of the hard mask and the SAC layer prior to forming the silicide layer, such that the contact plug is formed to be surrounded by the dielectric spacer.

* * * * *